(12) United States Patent
Huang et al.

(10) Patent No.: US 12,217,672 B2
(45) Date of Patent: Feb. 4, 2025

(54) PIXEL CIRCUIT AND DRIVING METHOD THEREOF, DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Binyan Wang, Beijing (CN); Meng Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/772,288

(22) PCT Filed: May 20, 2021

(86) PCT No.: PCT/CN2021/094877
§ 371 (c)(1),
(2) Date: Apr. 27, 2022

(87) PCT Pub. No.: WO2022/241713
PCT Pub. Date: Nov. 24, 2022

(65) Prior Publication Data
US 2024/0144873 A1 May 2, 2024

(51) Int. Cl.
*G09G 3/3233* (2016.01)
(52) U.S. Cl.
CPC ... *G09G 3/3233* (2013.01); *G09G 2300/0408* (2013.01); *G09G 2300/0819* (2013.01);
(Continued)

(58) Field of Classification Search
CPC ......... G09G 3/3233; G09G 2300/0408; G09G 2300/0819; G09G 2300/0852;
(Continued)

(56) References Cited

U.S. PATENT DOCUMENTS 10,083,658 B2   9/2018   Wang et al.
11,263,957 B2   3/2022   He
(Continued)

FOREIGN PATENT DOCUMENTS

CN   105185305 A   12/2015
CN   108490710 A   9/2018
(Continued)

OTHER PUBLICATIONS

Extended European Search Report dated Jul. 28, 2023 received in European Patent Application No. EP 21940168.4.

*Primary Examiner* — Jeff Piziali
(74) *Attorney, Agent, or Firm* — Scully, Scott, Murphy & Presser, P.C.

(57) ABSTRACT

A pixel circuit and a driving method thereof, a display substrate and a display device are provided. The pixel circuit includes a driving sub-circuit, a first switch sub-circuit and a first light-emitting control sub-circuit. The driving sub-circuit includes a control terminal connected with a first node, a first terminal connected with a second node and a second terminal connected with a third node, and is configured to control a driving signal from the first node to the third node for driving a light-emitting element; the first switch sub-circuit is configured to control conduction of the driving signal between the third node and a fourth node; the first light-emitting control sub-circuit is connected with a first electrode of the light-emitting element through a fifth node, and is configured to control conduction of the driving signal between the fourth node and the fifth node.

20 Claims, 17 Drawing Sheets

(52) U.S. Cl.
CPC ............... *G09G 2300/0852* (2013.01); *G09G 2300/0861* (2013.01); *G09G 2310/0262* (2013.01); *G09G 2310/08* (2013.01); *G09G 2320/0233* (2013.01)

(58) Field of Classification Search
CPC ... G09G 2300/0861; G09G 2310/0262; G09G 2310/08; G09G 2320/0233; G09G 2300/0426; G09G 2310/0251; G09G 2320/045; H10K 59/131
See application file for complete search history.

(56) References Cited

U.S. PATENT DOCUMENTS

| | | | | |
|---|---|---|---|---|
| 11,741,890 | B2 * | 8/2023 | Ryoo | G09G 3/3233 345/55 |
| 2009/0051636 | A1 | 2/2009 | Natori | |
| 2017/0061876 | A1 * | 3/2017 | Cho | G09G 3/3233 |
| 2020/0091252 | A1 * | 3/2020 | Bang | H10K 50/80 |
| 2020/0211474 | A1 * | 7/2020 | Kim | G09G 3/3291 |
| 2021/0064087 | A1 | 3/2021 | Ma et al. | |
| 2021/0201760 | A1 | 7/2021 | Wang et al. | |
| 2021/0366409 | A1 | 11/2021 | Kim et al. | |
| 2021/0375943 | A1 * | 12/2021 | Lee | H01L 27/1255 |
| 2022/0069047 | A1 | 3/2022 | Yang et al. | |
| 2022/0180810 | A1 * | 6/2022 | Zhang | G09G 3/3241 |
| 2022/0271107 | A1 | 8/2022 | Liu et al. | |
| 2023/0133704 | A1 * | 5/2023 | Gai | G09G 3/3266 345/691 |
| 2024/0072223 | A1 * | 2/2024 | Li | H01L 25/0753 |

FOREIGN PATENT DOCUMENTS

| | | |
|---|---|---|
| CN | 109872680 A | 6/2019 |
| CN | 110047436 A | 7/2019 |
| CN | 110265458 A | 9/2019 |
| CN | 110289286 A | 9/2019 |
| CN | 111028757 A | 4/2020 |
| CN | 111462641 A | 7/2020 |
| CN | 111462695 A | 7/2020 |
| CN | 111798789 A | 10/2020 |
| CN | 111916486 A | 11/2020 |
| CN | 112397026 A | 2/2021 |
| CN | 112562589 A | 3/2021 |
| CN | 112599097 A | 4/2021 |
| CN | 112767879 A | 5/2021 |
| IN | 107945740 A | 4/2018 |

* cited by examiner

204

PIXEL CIRCUIT AND DRIVING METHOD THEREOF, DISPLAY SUBSTRATE AND DISPLAY DEVICE

CROSS-REFERENCE TO RELATED APPLICATIONS

This application is a national phase entry of PCT International Application No. PCT/CN2021/094877, filed on May 20, 2021. The disclosure of PCT International Application No. PCT/CN2021/094877 is incorporated by reference herein.

TECHNICAL FIELD

Embodiments of the present disclosure relate to a pixel circuit and a driving method thereof, a display substrate and a display device.

BACKGROUND

At present, display screens of display devices are developed into large screens and full screens. The display devices (such as mobile phones, tablet computers, etc.) usually have camera devices (or imaging devices), and the camera devices are usually arranged at one side outside a display area of the display screen. However, a certain space is needed for installing the camera device, which is against the full-screen design and narrow-rim design of the display screen. For example, the camera device may be combined with the display area of the display screen, and a position is reserved for the camera device in the display area so as to maximize the display area of the display screen.

SUMMARY

At least an embodiment of the present disclosure provides a pixel circuit comprising a driving sub-circuit, a data write sub-circuit, a compensation sub-circuit, a first switch sub-circuit and a first light-emitting control sub-circuit. The driving sub-circuit comprises a control terminal connected with a first node, a first terminal connected with a second node and a second terminal connected with a third node, wherein the driving sub-circuit is configured to control a driving signal from the first node to the third node for driving a light-emitting element according to a voltage of the first node; the data write sub-circuit is connected with the second node and configured to write a data signal to the second node in response to a first scanning signal; the compensation sub-circuit connected with the first node and the third node, and configured to electrically connect the first node and the third node in response to a second scanning signal, so as to control the driving sub-circuit to write a compensation voltage to the first node according to the data signal written to the second node; the first switch sub-circuit is configured to control conduction of the driving signal between the third node and a fourth node according to the voltage of the third node in response to a first switch control signal; the first light-emitting control sub-circuit is connected with the fourth node and the fifth node, and connected with a first electrode of the light-emitting element through the fifth node, wherein the first light-emitting control sub-circuit is configured to control conduction of the driving signal between the fourth node and the fifth node in response to a first light-emitting control signal, so that the driving signal can be applied to the light-emitting element.

In some examples, the pixel circuit further comprises a first reset sub-circuit, wherein the first reset sub-circuit is connected with the fifth node, and is configured to write a first reset voltage to the fifth node in response to a first reset control signal.

In some examples, the pixel circuit further comprises the first reset sub-circuit, wherein the first reset sub-circuit is connected with the fourth node, and is configured to write the first reset voltage to the fourth node in response to a first reset control signal.

In some examples, the pixel circuit further comprises a first reset sub-circuit and a second switch sub-circuit, wherein the first reset sub-circuit is connected with a sixth node, and is connected with the second switch sub-circuit through the sixth node, and the first reset sub-circuit is configured to write a first reset voltage to the sixth node in response to a first reset control signal; and the second switch sub-circuit is connected with the fourth node and the sixth node, and is configured to control conduction between the fourth node and the sixth node in response to a second switch control signal, so that the first reset voltage from the first reset sub-circuit can be written to the fourth node.

In some examples, the pixel circuit further comprises a second light-emitting control sub-circuit, wherein the second light-emitting control sub-circuit is connected with the second node and a first power supply voltage terminal and is configured to write a first power supply voltage from the first power supply voltage terminal to the second node in response to a second light-emitting control signal.

In some examples, the pixel circuit further comprises a storage sub-circuit, wherein the storage sub-circuit comprises a first terminal and a second terminal, and the first terminal of the storage sub-circuit is connected with the first power supply voltage terminal and the second terminal of the storage sub-circuit is connected with the first node.

In some examples, the pixel circuit further comprises a second reset sub-circuit, wherein the second reset sub-circuit is connected with the first node, and is configured to write a second reset voltage to the first node in response to a second reset control signal.

In some examples, the pixel circuit further comprises a first capacitor, wherein the first capacitor comprises a first electrode and a second electrode, the first electrode of the first capacitor is connected with the fourth node, and the second electrode of the first capacitor is configured to be applied with a same voltage as a second electrode of the light-emitting element.

In some examples, the pixel circuit further comprises a second capacitor, wherein a first electrode of the second capacitor is connected with the fourth node, and the first electrode of the light-emitting element serves as a second electrode of the second capacitor.

At least an embodiment of the present disclosure provides a display substrate, comprising a base substrate and a plurality of sub-pixels, arranged on the base substrate in an array along a first direction and a second direction, wherein the plurality of sub-pixels comprise a first sub-pixel, and the first sub-pixel comprises the pixel circuit provided by any one of the above embodiments and the light-emitting element; the display substrate comprises a first display area and a second display area, and the first display area at least partially surrounds the second display area; and the driving sub-circuit and the first switch sub-circuit of the pixel circuit both are in the first display area, and the light-emitting element and the first light-emitting control sub-circuit of the pixel circuit are in the second display area.

The display substrate further comprises a connection line, and one end of the connection line is electrically connected with the first light-emitting control sub-circuit, and another end of the connection line is extended to the first display area so as to be electrically connected with the first switch sub-circuit; and the connection line is made of a transparent conductive material.

In some examples, in a direction perpendicular to the base substrate, the connection line is at least partially overlapped with the first electrode of the light-emitting element.

In some examples, the first light-emitting control sub-circuit comprises a light-emitting control transistor, a first electrode of the light-emitting control transistor is electrically connected with the connection line through a first via hole; and a second electrode of the light-emitting control transistor is electrically connected with the first electrode of the light-emitting element through a second via hole.

In some examples, the display substrate further comprises a first connection electrode, the first connection electrode is on a side of the connection line close to the base substrate, and the first electrode of the light-emitting control transistor is electrically connected with the connection line through the first connection electrode.

In some examples, an orthographic projection of the first electrode of the light-emitting element on the base substrate covers an orthographic projection of the first connection electrode on the base substrate.

In some examples, the first electrode of the light-emitting element comprises an electrode main body portion and an electrode protrusion portion protruded from the electrode main body portion, and the electrode main body portion is used to contact a light-emitting layer of the light-emitting element, and the electrode protrusion portion is electrically connected with the second electrode of the light-emitting control transistor through the second via hole; and an orthographic projection of the second via hole on the base substrate is further from the orthographic projection of the electrode main body portion on the base substrate than the orthographic projection of the first via hole on the base substrate.

In some examples, the display substrate further comprises a light-emitting control line in the second display area, and the light-emitting control line is made of a transparent conductive material; and the light-emitting control line is electrically connected with a gate electrode of the light-emitting control transistor to provide the light-emitting control signal.

In some examples, in a direction perpendicular to the base substrate, the light-emitting control line is on a side of the connection line close to the first electrode of the light-emitting element.

In some examples, in a case where the pixel circuit further comprises a second switch sub-circuit, the second switch sub-circuit is in the first display area, and the display substrate further comprises an auxiliary light-emitting control line in the first display area, and the second switch sub-circuit is connected with the auxiliary light-emitting control line to receive a second switch control signal; and the auxiliary light-emitting control line is electrically connected with the light-emitting control line.

At least an embodiment of the present disclosure further provides a display device, comprising the display substrate provided by any one of the above embodiments.

In some examples, the display device further comprises a sensor, and the display substrate comprises a first side for display and a second side opposite to the first side; and the sensor is arranged at the second side of the display substrate, and is configured to receive light from the first side of the display substrate and passing through the second display area for sensing.

At least an embodiment of the present disclosure further provides a driving method driving the pixel circuit provided by any one of the above embodiments, comprising: turning on the data write sub-circuit and turning off the first switch sub-circuit and the first light-emitting control sub-circuit at a data write and compensation stage, so that the data signal is written to the second node, and the driving sub-circuit is compensated; turning on the first switch sub-circuit and turning off the first light-emitting control sub-circuit at a pre-charging stage to charge the fourth node, so that a potential of the fourth node reaches a preset value; and turning on the first switch sub-circuit and the first light-emitting control sub-circuit at a light-emitting stage, applying the potential of the fourth node to the fifth node, and applying the driving signal to the light-emitting element, so that the light-emitting element emits light.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1A:
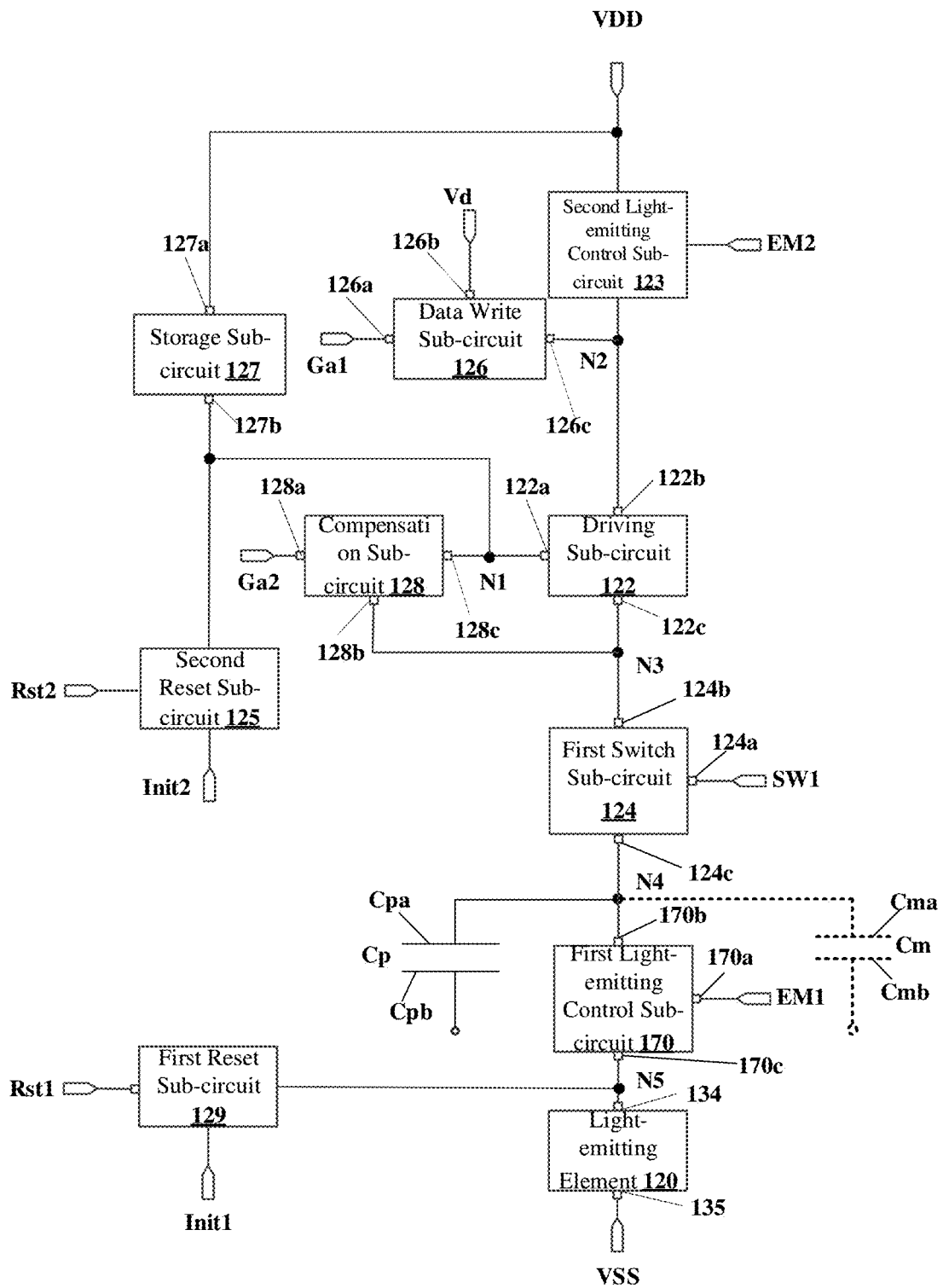
FIG. 1A is a schematic diagram of a pixel circuit provided by at least one embodiment of the present disclosure.

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly In a display device that is integrated with an imaging element, providing the imaging element in a display area of the display device helps to increase a screen-to-body ratio, for example, to realize full-screen display. The display area is provided with a display device, which may affect a light transmission rate of the imaging element and further affect a sensing effect. For example, light-emitting elements and light-proof routings in sub-pixels may prevent the imaging element from absorbing light, thereby affecting the imaging quality.

For example, the light transmission of the display area with the imaging element may be improved by reducing pixel circuit structures in the display area, and the display area with the imaging element is referred to as a transparent display area, for example. For example, the pixel circuit connected with the light-emitting element of the transparent display area may be arranged in a display area outside the transparent display area, that is, the light-emitting elements connected with some pixel circuits are moved to the transparent display area without emitting light on site, so that the display uniformity is improved, and the light transmission rate of the transparent display area is also increased.

For example, one implementation manner is to form the transparent display area by reducing the number of pixel circuits without changing the size of the pixel circuit. For example, the pixel circuits that are originally located in the transparent display area are removed directly. Since the number of the pixel circuits corresponds to the number of the light-emitting elements driven by the pixel circuits, the number of the light-emitting elements needs to be reduced correspondingly. For example, the arrangement density of the effective light-emitting elements in the transparent display area may be reduced. This way may reduce the uniformity of the display brightness.

For example, one way is to reduce the size of the pixels without changing the number of the pixel circuits, thereby reserving a space of the transparent display area. For example, the size of the pixel circuit is reduced in a horizontal direction (a row direction), and is unchanged in the longitudinal direction (a column direction). This may provide sufficient pixel circuits to drive the same number of light-emitting elements, so that the density of the light-emitting elements is not affected. For example, the light-emitting elements have uniform density in the display area. This way may further improve the display uniformity and reduce the influence of the transparent display area on the display effect.

Generally, pixel electrodes of the light-emitting elements need to be connected with the pixel circuits driving the light-emitting elements through connection lines or connection electrodes. It is discovered by the inventor that parasitic capacitance generated between the connection line or connection electrode and other conductive structures may have an adverse effect on the display effect of the light-emitting element. For example, the parasitic capacitor may increase the charging time of the pixel electrode, thereby postponing the lighting time of the light-emitting element, causing the reduction of the light-emitting time.

For example, the connection between the light-emitting element located in the transparent display area and the pixel circuit driving the light-emitting element outside the transparent display area needs a long connection line, which results in large parasitic capacitor at the pixel electrode, so that the charging time needed by the pixel electrode at a light-emitting stage is increased; and for example, at the light-emitting stage, the time for charging a potential of the pixel electrode to reach a lighting voltage of the light-emitting element is longer (for example, compared with the in-situ light-emitting sub-pixel in the display area outside the transparent display area), so that the light-emitting time is shortened, which finally results in non-uniformity of the brightness. Furthermore, in the transparent display area, different lengths, shapes or positions of the connection line connected with the pixel electrode of the light-emitting element may also cause different parasitic capacitance, which may lead to inconsistent lighting time of the light-emitting elements at the light-emitting stage, causing display Mura.

At least one embodiment of the present disclosure provides a pixel circuit including a driving sub-circuit, a data write sub-circuit, a compensation sub-circuit, a first switch sub-circuit and a first light-emitting control sub-circuit. The driving sub-circuit includes a control terminal connected with a first node, a first terminal connected with a second node and a second terminal connected with a third node, and the driving sub-circuit is configured to control a driving signal from the first node to the third node for driving the light-emitting element according to a voltage of the first node; the data write sub-circuit is connected with the second node and configured to write a data signal to the second node in response to a first scanning signal; the compensation sub-circuit is connected with the first node and the third node and configured to electrically connect the first node and the third node in response to a second scanning signal so as to control the driving sub-circuit to write a compensation voltage to the first node according to the data signal written to the second node; the first switch sub-circuit is configured to control the conduction of the driving signal between the third node and the fourth node according to the voltage of the third node in response to a first switch control signal; and the first light-emitting control sub-circuit is connected with a fifth node and connected with a first electrode of the light-emitting element through the fifth node, and the first light-emitting control sub-circuit is configured to control the conduction of the driving signal between the fourth node and the fifth node in response to the first light-emitting control signal, so that the driving signal can be applied to the light-emitting element.

For example, the driving signal may be a driving voltage or a driving current used to drive the light-emitting element.

According to the pixel circuit provided by the embodiment of the present disclosure, the fourth node N4, where parasitic capacitance is prone to generate, of the first light-emitting control sub-circuit is spaced apart from the fifth node N5 that is directly connected with the light-emitting element, and the first light-emitting control sub-circuit may control the conduction between the fourth node N4 and the fifth node N5, so that the fourth node may be charged in advance before the light-emitting stage; for example, sufficient time is provided for charging the fourth node before the beginning of the light-emitting stage, so that after the circuit enters the light-emitting stage, the influence of the parasitic capacitance at the fourth node on the lighting time of the light-emitting element is reduced, and the display Mura is alleviated. For example, at the light-emitting stage, the first light-emitting control sub-circuit is turned on in response to the first light-emitting control signal to conduct the driving signal between the fourth node and the fifth node, and the potential of the fourth node is copied to the fifth node that is connected with the light-emitting element; and since the fourth node is charged in advance, the potential of the fifth node may reach the lighting voltage of the light-emitting element rapidly, so that the lighting time is not affected by the parasitic capacitance at the fourth node N4 anymore.

FIG. 1A is a schematic diagram of a pixel circuit provided by at least one embodiment of the present disclosure. As shown in FIG. 1A, the pixel circuit includes a driving sub-circuit 122, a data write sub-circuit 126, a compensation sub-circuit 128, a first switch sub-circuit 124 and a first light-emitting control sub-circuit 170.

The driving sub-circuit 122 includes a control terminal 122a connected with a first node N1, a first terminal 122b connected with a second node N2 and a second terminal 122c connected with a third node N3; and the driving sub-circuit 122 is configured to control a driving signal from the first node N1 to the third node N3 for driving a light-emitting element 120 according to a voltage of the first node N1. For example, the driving signal may be a driving voltage or a driving current used to drive the light-emitting element.

The data write sub-circuit 126 is connected with the second node N2, and configured to write a data signal Vd to the second node N2 in response to a first scanning signal Ga1. For example, the data write sub-circuit 126 includes a control terminal 126a, a first terminal 126b and a second terminal 126c; the control terminal 126a is configured to receive the first scanning signal Ga1; the first terminal 126b is configured to receive the data signal Vd; and the second terminal 126c is connected with the second node N2. For example, at a data write and compensation stage, the data write sub-circuit 126 may be turned on in response to the first scanning signal Ga1, so that the data signal may be written to the first terminal 122b (the second node N2) of the driving sub-circuit 122 and stored, so that the driving signal for driving the light-emitting element 120 to emit light may be generated according to the data signal at the light-emitting stage, for example.

The compensation sub-circuit 128 is connected with the first node N1 and the third node N3, and configured to conduct the first node N1 and the third node N3 in response to a second scanning signal Ga2, so that the driving sub-circuit 122 is controlled to write a compensation voltage to the first node N1 according to the data signal Vd written to the second node N2. For example, the compensation sub-circuit 128 includes a control terminal 128a, a first terminal 128b and a second terminal 128c; the control terminal 128a is configured to receive the second scanning signal Ga2; the first terminal 128b is connected with the third node N3; and the second terminal 128c is connected with the first node N1.

For example, the first scanning signal Ga1 may be the same as the second scanning signal Ga2. For example, the first scanning signal Ga1 and the second scanning signal Ga2 may be connected to a same signal output terminal. For example, the first scanning signal Ga1 and the second scanning signal Ga2 may be transmitted by a same scanning line.

In other examples, the first scanning signal Ga1 may be different from the second scanning signal Ga2. For example, the first scanning signal Ga1 and the second scanning signal Ga2 may be connected to different signal output terminals. For example, the first scanning signal Ga1 and the second scanning signal Ga2 may be transmitted respectively by different scanning lines.

The first switch sub-circuit 124 is configured to control the conduction of the driving signal between the third node N3 and the fourth node N4 according to a voltage of the third node N3 in response to a first switch control signal SW1. For example, the first switch sub-circuit 124 includes a control terminal 124a, a first terminal 124b and a second terminal 124c; the control terminal 124a is configured to receive the first switch control signal SW1; and the first terminal 124b and the second terminal 124c are connected with the third node N3 and the fourth node N4 respectively.

The first light-emitting control sub-circuit 170 is connected with a fifth node N5 and connected with a first electrode 134 of the light-emitting element 120 through the fifth node N5; and the first light-emitting control sub-circuit 170 is configured to control the conduction of the driving signal between the fourth node N4 and the fifth node N5 in response to a first light-emitting control signal EM1, so that the driving signal may be applied to the light-emitting element 120. For example, the first light-emitting control sub-circuit 170 includes a control terminal 170a, a first terminal 170b and a second terminal 170c; the control terminal 170a is configured to receive the first light-emitting control signal EW1; and the first terminal 170b and the second terminal 170c are connected with the fourth node N4 and the fifth node N5 respectively.

The first light-emitting control sub-circuit 170 is arranged between the fourth node N4 and a pixel electrode (i.e. the first electrode 134 of the light-emitting element 120) to avoid the direct connection between the fourth node N4 and the pixel electrode, so that the influence of a possible parasitic capacitor Cp (an example of a second capacitor of the present disclosure) at the fourth node N4 on the pixel electrode may be reduced effectively. For example, before the light-emitting stage, the first switch sub-circuit 124 may be turned on, and the first light-emitting control sub-circuit 170 may be turned off, so that the fourth node N4 may be pre-charged (for example, charged to the lighting voltage of the light-emitting element); and at the light-emitting stage, the first switch sub-circuit 124 and the first light-emitting control sub-circuit 170 are turned on simultaneously, and under the action of the driving current, the prepared potential on the fourth node N4 is copied to the fifth node N5 rapidly, so that the display Mura phenomenon caused by the occupation of the charging time needed by the parasitic capacitance on the lighting time is avoided, and the light-emitting uniformity is improved.

For example, at the light-emitting stage, the first light-emitting control sub-circuit 170 is turned on in response to the first light-emitting control signal EM1 provided by a first light-emitting control terminal EM1, and meanwhile, the first switch sub-circuit 124 is also turned on, so that the driving sub-circuit 122 may be connected with the light-emitting element 120 electrically through the first switch sub-circuit 124 and the first light-emitting control sub-circuit 170, thereby driving the light-emitting element 120 to emit light under the control of the driving signal; and at the non-light-emitting stage, the first light-emitting control sub-circuit 170 is turned off in response to the first light-emitting control signal EM1, thereby preventing current from flowing through the light-emitting element 120 and causing the light-emitting element to emit light, and improving the contrast of a corresponding display device.

For example, the parasitic capacitor Cp includes a first electrode Cpa and a second electrode Cpb; the first electrode Cpa is connected with the fourth node; the second electrode Cpb may be, for example, the first electrode 134 of the light-emitting element 120 or other signal routings, that is, the parasitic capacitor Cp is formed between the second terminal 170b of the first light-emitting control sub-circuit 170 and the first electrode 134 of the light-emitting element 120 or other signal routings.

For example, the pixel circuit may also include a simulation capacitor Cm (an example of a first capacitor of the present disclosure). The simulation capacitor Cm includes a first electrode Cma and a second electrode Cmb; the first electrode Cma is connected with the fourth node; and the second electrode Cmb is, for example, configured to apply the same voltage as the second electrode 135 of the light-emitting element 120, such as a second power supply voltage VSS. Thus, the simulation capacitor Cm may simulate the capacitor of the light-emitting element 120, thereby constructing for the fourth node N4 a same or similar environment as the fifth node N5, so that the potential of the fourth node N4 is copied to the fifth node N5 rapidly at the light-emitting stage.

For example, the pixel circuit may also include a first reset sub-circuit 129; and the first reset sub-circuit 129 is connected with the fifth node N5 and configured to write a first reset voltage Init1 to the fourth node N4 in response to a first reset control signal Rst1.

For example, the pixel circuit may also include a second reset sub-circuit 125; and the second reset sub-circuit 125 is connected with the first node N1 and configured to write a second reset voltage Init2 to the first node N1 in response to a second reset control signal Rst2.

For example, the pixel circuit may also include a second light-emitting control sub-circuit 123; and the second light-emitting control sub-circuit 123 is connected with a first power supply voltage terminal VDD and the second node N2 and configured to write a first power supply voltage VDD from the first power supply voltage terminal VDD to the second node N2 in response to a second light-emitting control signal EM2. For example, the second light-emitting control signal and the first switch control signal SW1 may be a same signal or different signals.

For another example, at an initialization stage, the second light-emitting control sub-circuit 123 may also be turned on in response to the second light-emitting control signal, so as to perform a reset operation on the driving sub-circuit 122 and the light-emitting element 120 combining with the reset circuit.

For example, the first reset voltage Init1 and the second reset voltage Init2 may be a same voltage signal or different voltage signals. For example, the first reset control signal Rst1 and the second reset control signal Rst2 may be a same signal or different signals.

For example, the first reset sub-circuit 129 and the second reset sub-circuit 125 may be turned on respectively in response to the first reset control signal Rst1 and the second reset control signal Rst2, so that the first reset voltage Init1 may be applied to the first electrode 134 of the light-emitting element 120, and the second reset voltage Init2 may be applied to the first node N1 respectively, thereby performing the reset operation on the driving sub-circuit 122, the compensation sub-circuit 128 and the light-emitting element 120, and eliminating the influence of a previous light-emitting stage.

For example, the pixel circuit may also include a storage sub-circuit 127; the storage sub-circuit 127 includes a first terminal 127a and a second terminal 127b; and the first terminal 127a and the second terminal 127b are connected with the first power supply voltage terminal VDD and the first node N1 respectively. For example, at the data write and compensation stage, the compensation sub-circuit 128 may be turned on in response to the second scanning signal Ga2, so that the data signal written by the data write sub-circuit 126 may be stored in the storage sub-circuit 127; and at the same time, the compensation sub-circuit 128 may electrically connect the first node N1 and the third node N3, that is, the control terminal 122a and the second terminal 122c of the driving sub-circuit 122 are connected electrically, so that relevant information of a threshold voltage of the driving sub-circuit 122 is correspondingly stored in the storage sub-circuit, for example, the stored data signal and threshold voltage may be used to control the driving sub-circuit 122 at the light-emitting stage, and the driving sub-circuit 122 is compensated.

For example, the light-emitting element 120 includes a first electrode 134 and a second electrode 135; the first electrode 134 of the light-emitting element 120 is configured to be connected with the second terminal 122c of the driving sub-circuit 122; and the second electrode 135 of the light-emitting element 120 is configured to be connected with a second power supply voltage terminal VS S.

It should be noted that in the description of the embodiments of the present disclosure, the first node N1, the second node N2, the third node N3, the fourth node N4 and the fifth node and a sixth node described below do not necessarily indicate actual parts, but indicate joint points of relevant circuits in a circuit diagram.

It should be noted that in the description of the embodiments of the present disclosure, the symbol Vd may indicate both a data signal terminal and a level of the data signal; similarly, the symbols Ga1 and Ga2 may indicate the first scanning signal and the second scanning signal, and may also indicate a first scanning signal terminal and a second scanning signal terminal; EM1 and EM2 may indicate the first light-emitting control signal and the second light-emitting control signal, and may also indicate a first light-emitting control terminal and a second light-emitting control terminal; Rst1 and Rst2 may indicate the first reset control signal and the second reset control signal, and may also indicate a first reset control terminal and a second reset control terminal; the symbols Init1 and Init2 may indicate the first reset voltage terminal and the second reset voltage terminal, and may also indicate a first reset voltage and a second reset voltage; the symbol VDD may indicate the first power supply voltage terminal, and may also indicate the first power supply voltage; and the symbol VSS may not only indicate the second power supply voltage terminal, but also the second power supply voltage. The following embodiments are the same as the above and are note repeated here.

Figure 1B:
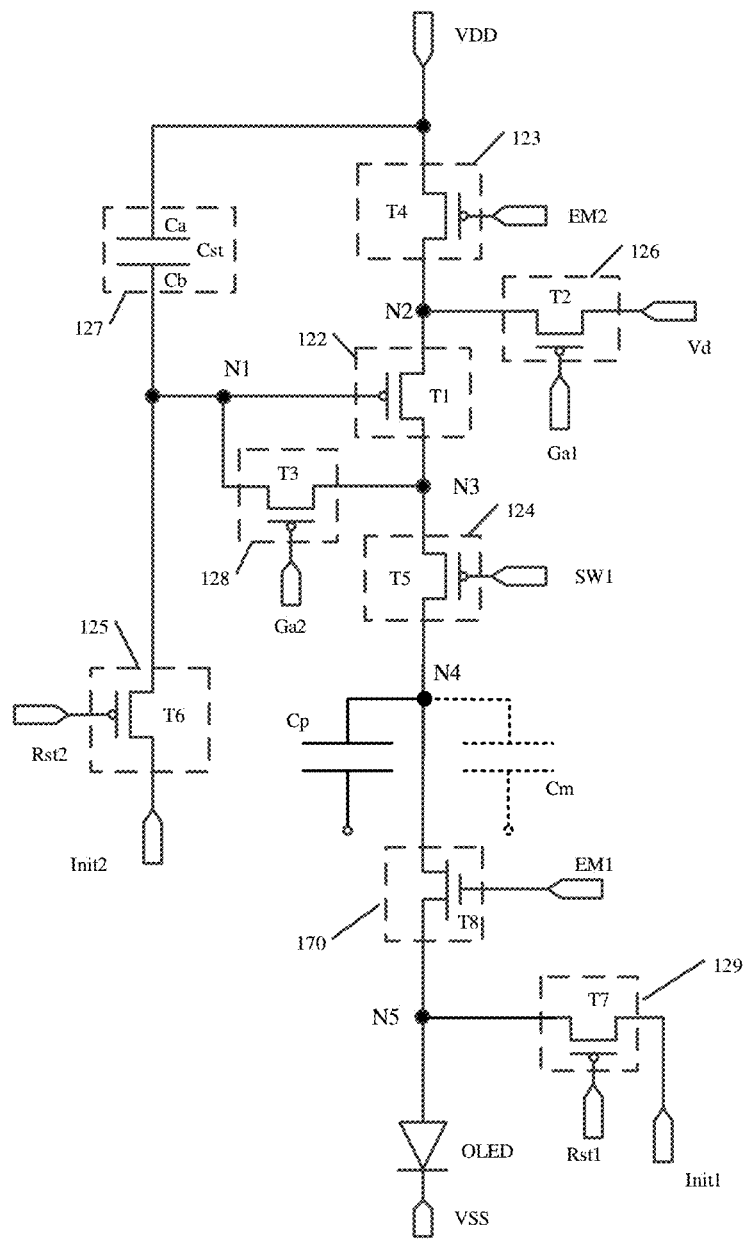
FIG. 1B is a circuit diagram of a specific example of the pixel circuit shown in FIG. 1A.

FIG. 1B illustrates a circuit diagram of a specific example of the circuit shown in FIG. 1A. As shown in FIG. 1B, the pixel circuit includes first to eighth transistors T1, T2, T3, T4, T5, T6, T7 and T8 and a storage capacitor Cst.

For example, as shown in FIG. 1B, the driving sub-circuit 122 may be implemented as the first transistor T1 (i.e. a driving transistor). A gate electrode of the first transistor T1 serves as a control terminal 122a of the driving sub-circuit 122 and is connected with the first node N1; a first electrode of the first transistor T1 serves as the first terminal 122b of the driving sub-circuit 122 and is connected with the second node N2; and a second electrode of the first transistor T1 serves as the second terminal 122c of the driving sub-circuit 122 and is connected with the third node N3.

For example, as shown in FIG. 1B, the data write sub-circuit 126 may be implemented as the second transistor T2. The gate electrode of the second transistor T2 is connected with a first scanning line (a first scanning signal terminal Ga1) so as to receive the first scanning signal; the first electrode of the second transistor T2 is connected with a data line (a data signal terminal Vd) so as to receive the data signal; and the second electrode of the second transistor T2 is connected with the first terminal 122b (the second node N2) of the driving sub-circuit 122.

For example, as shown in FIG. 1B, the compensation sub-circuit 128 may be implemented as the third transistor T3 (i.e. a compensation transistor). The gate electrode, the first electrode and the second electrode of the third transistor T3 serve as a control terminal 128a, a first terminal 128b and a second terminal 128c of the compensation sub-circuit respectively. The gate electrode of the third transistor T3 is configured to be connected with a second scanning line (a second scanning signal terminal Ga2) to receive the second scanning signal; the first electrode of the third transistor T3 is connected with the second terminal 122c (the third node N3) of the driving sub-circuit 122; and the second electrode of the third transistor T3 is connected with the control terminal 122a (the first node N1) of the driving sub-circuit 122.

For example, as shown in FIG. 1B, the first light-emitting control sub-circuit 170 may be implemented as the eighth transistor T8 (an example of a light-emitting control transistor of the present disclosure). The gate electrode of the eighth transistor T8 is connected with a first light-emitting control line (a first light-emitting control terminal EM1) to receive the first light-emitting control signal EM1; the first electrode of the eighth transistor T8 is connected with the fourth node N4; and the second electrode of the eighth transistor T8 is connected with the fifth node N5.

For example, as shown in FIG. 1B, the second light-emitting control sub-circuit 123 may be implemented as the fourth transistor T4. The gate electrode of the fourth transistor T4 is connected with a second light-emitting control line (a second light-emitting control terminal EM2) to receive the second light-emitting control signal EM2; the first electrode of the fourth transistor T4 is connected with the first power supply voltage terminal VDD to receive the first power supply voltage VDD; and the second electrode of the fourth transistor T4 is connected with the first terminal 122b (the second node N2) of the driving sub-circuit 122.

For example, as shown in FIG. 1B, the first switch sub-circuit 124 may be implemented as the fifth transistor T5; and the gate electrode, the first electrode and the second electrode of the fifth transistor T5 serve as the control terminal 124a, the first terminal 124b and the second terminal 124c of the first switch sub-circuit 124 respectively. For example, the second light-emitting control signal EM2 also serves as the first switch control signal SW1; in this case, the second light-emitting control line or the second light-emitting control terminal is also connected with the gate electrode of the fifth transistor T5 to provide the first switch control signal SW1; the first electrode of the fifth transistor T5 is connected with the second terminal 122c (the third node N3) of the driving sub-circuit 122; and the second electrode of the fifth transistor T5 is connected with the first terminal 170b (the fourth node N4) of the first light-emitting control sub-circuit 170.

For example, as shown in FIG. 1B, the storage sub-circuit 127 may be implemented as the storage capacitor Cst; the storage capacitor Cst includes a first capacitive electrode Ca and a second capacitive electrode Cb; the first capacitive electrode Ca is connected with the first power supply voltage terminal VDD; and the second capacitive electrode Cb is connected with the control terminal 122a of the driving sub-circuit 122.

For example, the first reset sub-circuit 129 may be implemented as the seventh transistor T7, and the second reset sub-circuit 125 may be implemented as the sixth transistor T6. The gate electrode of the seventh transistor T7 is configured to be connected with the first reset control terminal Rst1 to receive the first reset control signal Rst1; the first electrode of the seventh transistor T7 is connected with the first reset voltage terminal Init1 to receive the first reset voltage Init1; and the second electrode of the seventh transistor T7 is configured to be connected with the fifth node N5. The gate electrode of the sixth transistor T6 is configured to be connected with the second reset control terminal Rst2 to receive the second reset control signal Rst2; the first electrode of the sixth transistor T6 is connected with the second reset voltage terminal Init2 to receive the second reset voltage Init2; and the second electrode of the sixth transistor T6 is configured to be connected with the first node N1. For example, the first reset voltage terminal Init1 and the second reset voltage terminal Init2 may be the same voltage terminal.

For example, the light-emitting element 120 is specifically implemented as a light emitting diode (LED), for example, may be an organic light emitting diode (OLED), a quantum light emitting diode (QLED) or an inorganic light emitting diode, for example, may be a micro light emitting diode (Micro LED) or micro OLED. For example, the light-emitting element 120 may be a top emitting structure, a bottom emitting structure or a double-side emitting junction. The light-emitting element 120 may emit red light, green light, blue light or white light. The embodiments of the present disclosure do not limit a specific structure of the light-emitting element. For example, the light-emitting element 120 includes a first electrode 134, a second electrode 135 and a light-emitting layer arranged between the first electrode 134 and the second electrode 135.

For example, the first electrode 134 (that is also referred to as a pixel electrode such as an anode) of the light-emitting element 120 is connected with the fourth node N4 and is configured to be connected to the second terminal 122c of the driving sub-circuit 122 through the first switch sub-circuit 124; and the second electrode 135 (such as a cathode) of the light-emitting element 120 is connected with the second power supply voltage terminal VSS to receive the second power supply voltage VSS, and the current flowing into the light-emitting element 120 from the second terminal 122c of the driving sub-circuit 122 determines the brightness of the light-emitting element. For example, the second power supply voltage terminal may be grounded, that is, VSS may be 0V. For example, the second voltage power supply voltage VSS may also be a negative voltage.

It should be noted that the transistors used in the embodiments of the present disclosure may all be thin film transistors, field effect transistors or other switch devices with the same characteristics, and the embodiments of the present disclosure all are described by taking the thin film transistors as examples. Source and drain electrodes of the transistor used here may be symmetrical in structure, so that the source and drain electrodes may not be different in structure. In the embodiments of the present disclosure, in order to distinguish the other two electrodes of the transistor other than the gate electrode, one electrode is described directly as the first electrode, and the other electrode is described as the second electrode.

Furthermore, the transistors may be classified into N-type transistors and P-type transistors according to the characteristics of the transistors. When the transistors are the P-type transistors, the turn-on voltage is a low-level voltage (such as 0V, −5V, −10V or other appropriate voltages), and the turn-off voltage is a high-level voltage (such as 5V, 10V or other appropriate voltages); and when the transistors are the N-type transistors, the turn-on voltage is a high-level voltage (such as 5V, 10V or other appropriate voltages), and the turn-off voltage is a low-level voltage (0V, −5V, −10V or other appropriate voltages). For example, the transistors (T1-T9) adopted by at least some embodiments of the present disclosure all are P-type transistors, such as low-temperature polycrystalline silicon thin-film transistors. However, the type of the transistors is not specified by the embodiments of the present disclosure, and when the type of the transistors is changed, the connection relationship in the circuit shall be adjusted correspondingly.

Figure 1C:
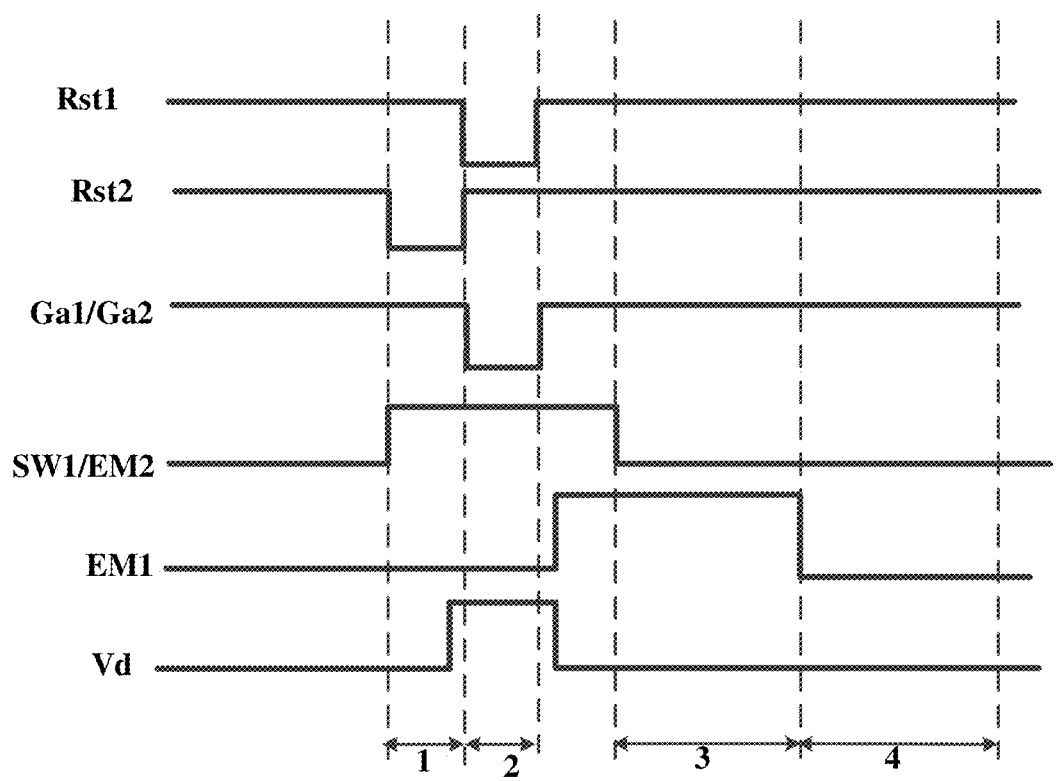
FIG. 1C is a sequence signal diagram of the pixel circuit provided by at least one embodiment of the present disclosure.

A working principle of the pixel circuit shown in FIG. 1B is described below in conjunction with a signal sequence diagram shown in FIG. 1C. As shown in FIG. 1C, a display process of each frame of image includes four stages, i.e. an initialization stage 1, a data write and compensation stage 2, a pre-charging stage 3 and a light-emitting stage 4.

As shown in FIG. 1C, in the present embodiment, the first scanning signal Ga1 and the second scanning signal Ga2 adopt a same signal, and the first switch control signal SW1 and the second light-emitting control signal EM2 adopt a same signal; the first reset control signal Rst1 and the first scanning signal Ga1/the second scanning signal Ga2 have the same waveform, that is, the second reset control signal Rst2 and the first scanning signal Ga1/the second scanning signal Ga2 may adopt the same signal; and the second reset signal Rst2 of the present row of sub-pixels has the same waveform as the first scanning signal Ga1/the second scanning signal Ga2 of a previous row of sub-pixels, that is, the same signal is adopted. However, the above is not used as a limitation to the present disclosure; and in other embodiments, different signals may be used as the first scanning signal Ga1, the second scanning signal Ga2, the first reset control signal Rst1 and the second reset control signal Rst2 respectively; and different signals are used as the first switch control signal SW1 and the second light-emitting control signal EM2 respectively.

At the initialization stage 1, the second reset control signal Rst2 is inputted to turn on the sixth transistor T6, and the second reset voltage Init2 is applied to the gate electrode of the first transistor T1 so as to reset the first node N1.

At the data write and compensation stage 2, the first scanning signal Ga1, the second scanning signal Ga2 and the data signal Vd are inputted and the second transistor T2 and the third transistor T3 are turned on; the data signal Vd is written to the second node N2 by the second transistor T2, and the first node N1 is charged through the first transistor T1 and the third transistor T3 by the data signal Vd, and until the potential of the first node N1 is changed to Vd+Vth, the first transistor T1 is turned off, wherein Vth is the threshold voltage of the first transistor T1. The potential of the first node N1 is stored in the storage capacitor Cst to be maintained, that is, the voltage information with the data signal and threshold voltage Vth are stored in the storage capacitor Cst so as to be used to provide the gray-level display data and compensate the threshold voltage of the first transistor T1 at the light-emitting stage subsequently.

At the data write and compensation stage 2, the first reset control signal Rst1 may also be inputted to turn on the seventh transistor T7, and the first reset voltage Init1 is applied to the fifth node N5, thereby resetting the fifth node N5. For example, the fifth node N5 may also be reset at the initialization stage 1, for example, the first reset control signal Rst1 and the second reset control signal Rst2 may be the same, which is not limited by the embodiments of the present disclosure.

At the pre-charging stage 3, the first switch control signal SW1, the second light-emitting control signal EM2 and the first light-emitting control signal EM1 are inputted to turn on the fifth transistor T5 and the fourth transistor T4 respectively and turn off the eighth transistor T8 so as to charge the fourth node N4, so that the potential of the fourth node N4 reaches a preset value, for example, a lighting voltage V0 of the light-emitting element 120; and for example, a voltage difference between the lighting voltage V0 and the voltage (such as the second power supply voltage VSS) of the second terminal 135 of the light-emitting element 120 is the turn-on voltage of the light-emitting element 120, for example, the turn-on voltage is the voltage difference between the two terminals of the light-emitting element when the light-emitting element emits the light with the brightness of 1 cd/m$^2$. When the second terminal 135 of the light-emitting element 120 is grounded, the lighting voltage V0 is equal to a numerical value of the turn-on voltage of the light-emitting element. For example, the duration of the pre-charging stage 3 is related to the parasitic capacitor Cp at the fourth node N4, and the greater the value of the parasitic capacitor Cp, the longer the duration of the pre-charging stage 3.

At the light-emitting stage 4, the first switch control signal SW1, the second light-emitting control signal EM2 and the first light-emitting control signal EM1 are inputted to turn on the fifth transistor T5, the fourth transistor T4 and the eighth transistor T8 respectively, and the eighth transistor T8 applies the potential of the fourth node N4 to the fifth node and applies the driving current to the OLED so as to enable the OLED to emit light. Since the potential of the fourth node N4 is already pre-charged, the voltage difference between the two terminals of the OLED can reach the turn-on voltage of the light-emitting element rapidly, thereby lighting light-emitting element 120. The value of the driving current I flowing by the OLED may be obtained according to the following formula:

$$I=K(VGS-Vth)^2=K[(Vdata+Vth-VDD)-Vth]^2=K(Vdata-VDD)^2,$$

wherein K is an electrical conductivity coefficient of the first transistor.

In the above formula, Vth indicates the threshold voltage of the first transistor T1, VGS indicates the voltage between the gate electrode and the source electrode (i.e. the first electrode here) of the first transistor T1, and K is a constant value related to the first transistor T1 itself. It may be seen from the above calculation formula I that the driving current I flowing by the OLED is not related to the threshold voltage Vth of the first transistor T1, so that the pixel circuit may be compensated, the drift problem of the threshold voltage caused by the technological process and long-time operation of the driving transistor (the first transistor T1 in the embodiment of the present disclosure) is solved, the influence on the driving current I is eliminated, and the display effect of the display device adopting the OLED may be improved.

Figure 2A:
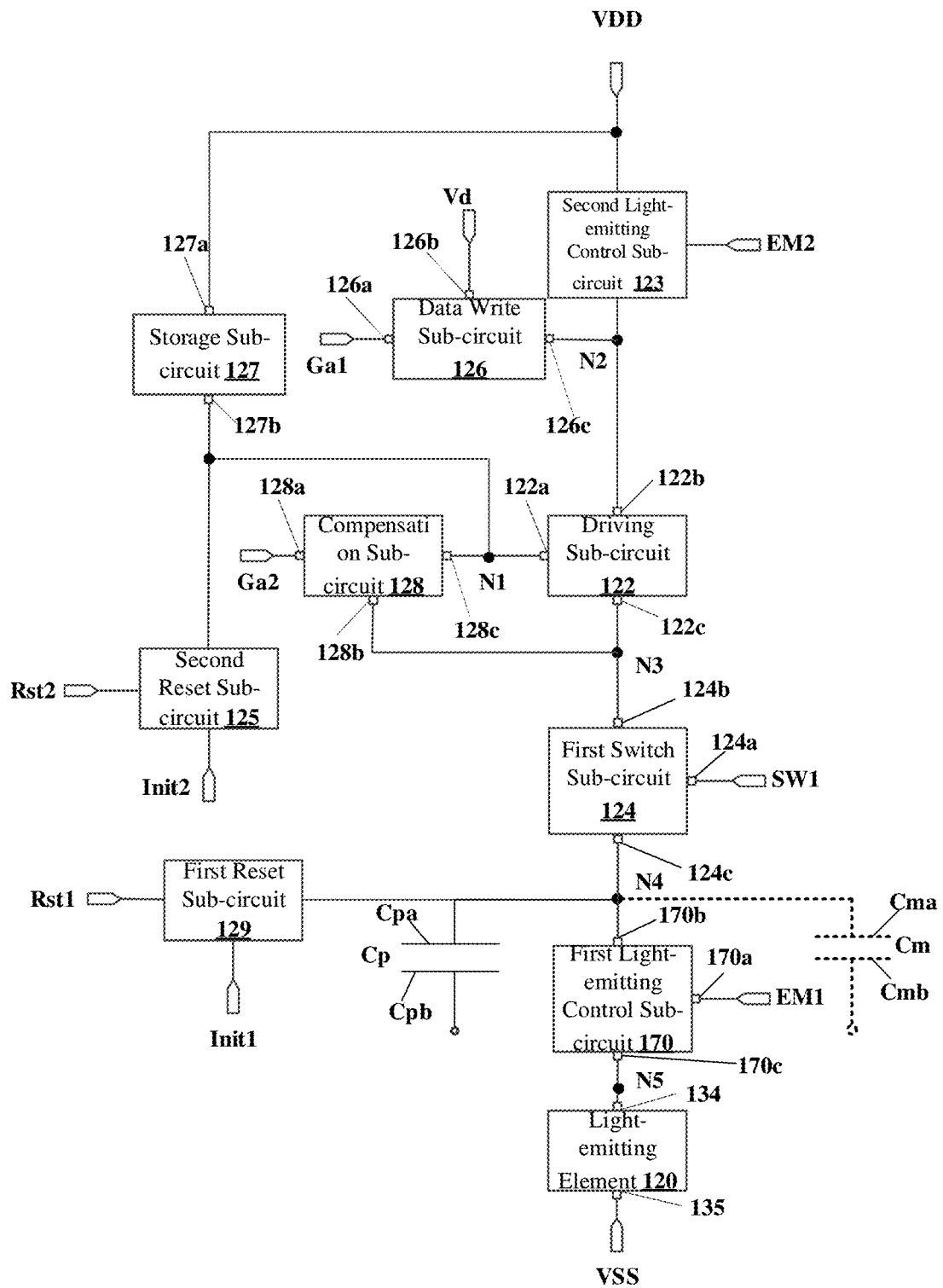
FIG. 2A is a schematic diagram of the pixel circuit provided by other embodiments of the present disclosure.

FIG. 2A is a schematic diagram of the pixel circuit provided by another embodiment of the present disclosure. The main difference between the pixel circuit provided by the present embodiment and the pixel circuit shown in FIG. 1A is that the first reset sub-circuit 129 is connected with the fourth node N4 and configured to write the first reset voltage Init1 to the fourth node N4 in response to the first reset control signal. Because after the first light-emitting control sub-circuit 170 is turned on, the potential of the fourth node N4 may be copied to the fifth node N5 rapidly, so that resetting the fourth node N4 is equivalent to resetting the fifth node N5. For example, referring to FIG. 1C, at the data write and compensation stage 2, the first reset sub-circuit 129 is turned on in response to the first reset control signal Rst1 to reset the fourth node N4; and meanwhile, the first light-emitting control sub-circuit 170 is turned on in response to the first light-emitting control signal EM1, and the potential of the fourth node N4 is copied to the fifth node N5 so as to reset the fifth node N5.

Figure 2B:
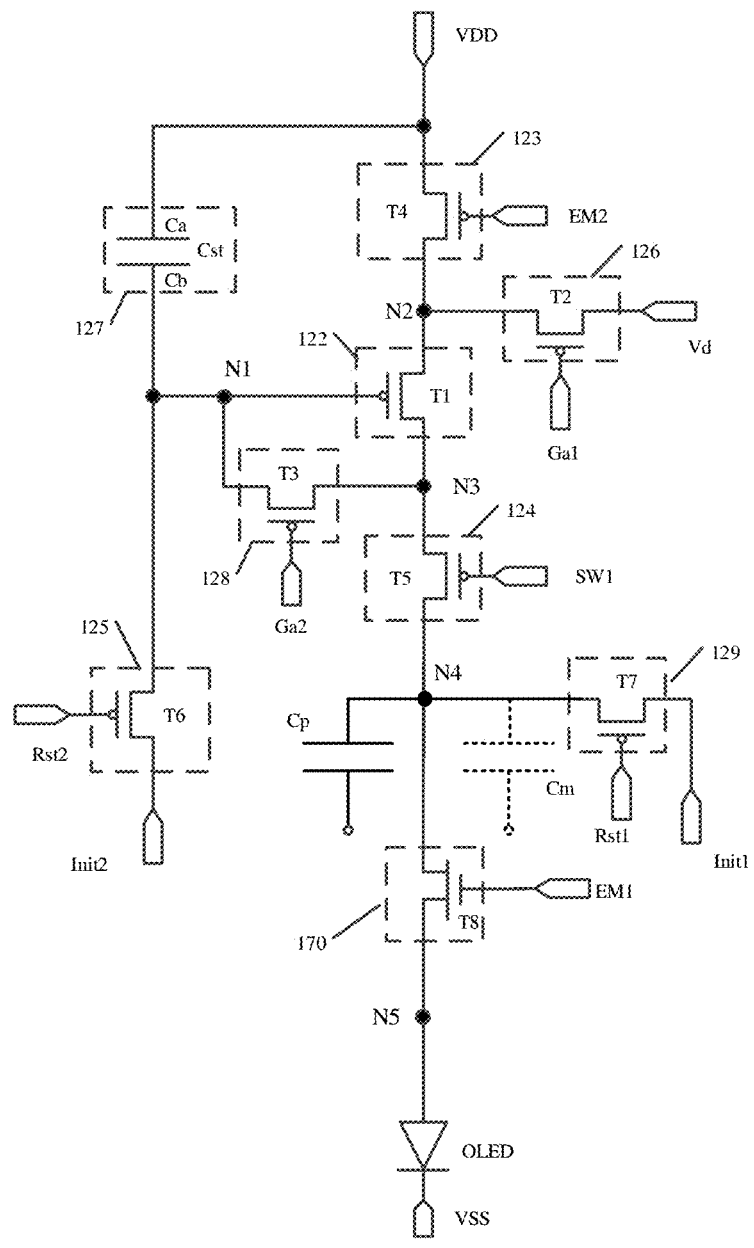
FIG. 2B is a circuit diagram of a specific example of the pixel circuit shown in FIG. 2A.

FIG. 2B illustrates a circuit diagram of a specific example of the circuit shown in FIG. 2A; and the specific description may refer to the description of FIGS. 1B and 1s not repeated here.

Figure 3A:
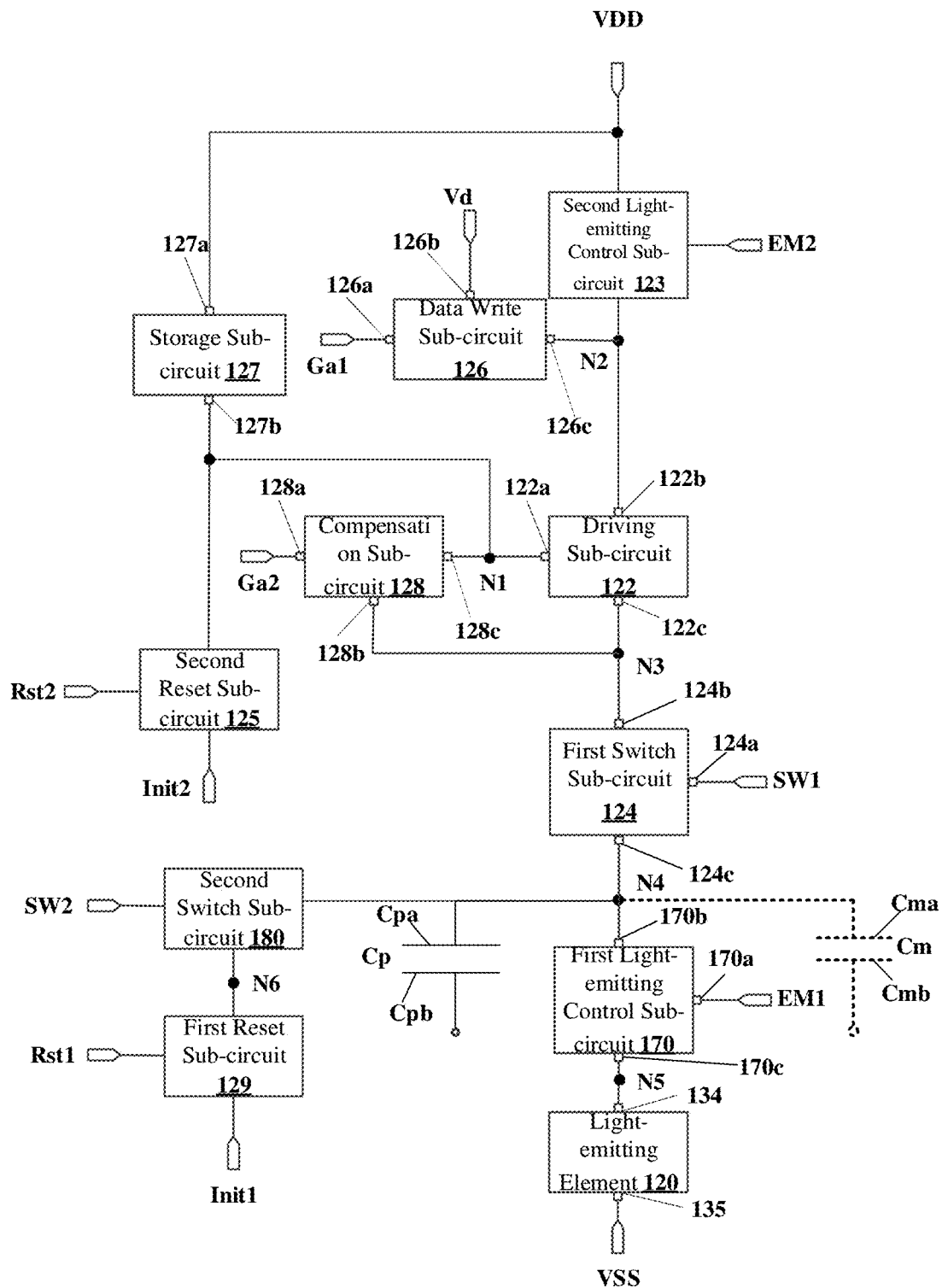
FIG. 3A is a schematic diagram of the pixel circuit provided by further other embodiments of the present disclosure.

FIG. 3A is a schematic diagram of the pixel circuit provided by another embodiment of the present disclosure. The pixel circuit provided by the present embodiment differs from the pixel circuit shown in FIG. 1A mainly in that the pixel circuit also includes a second switch sub-circuit 180, the second switch sub-circuit 180 is connected with the fourth node N4, and the first reset sub-circuit 129 is connected with a sixth node N6 and connected with the second switch sub-circuit 180 through the sixth node N6.

The first reset sub-circuit 129 is configured to write the first reset voltage Init1 to the sixth node in response to the first reset control signal Rst1; and the second switch sub-circuit 180 is configured to control the conduction of the fourth node N4 and the sixth node N6 in response to the second switch control signal SW2, so that the first reset voltage Init1 from the first reset sub-circuit 129 may be written to the fourth node N4, thereby resetting the fourth node N4.

For example, the second switch control signal SW2 and the first light-emitting control signal EM1 may be the same signal. For example, referring to FIG. 1C, at the data write and compensation stage 2, the first light-emitting control signal EM1/the second switch control signal SW2 are turn-on signals; the second switch sub-circuit 180 is turned on, so that the second switch sub-circuit 180 does not affect the reset operation of the first reset sub-circuit 129 on the fourth node N4.

In the circuit layout of an actual display substrate, the second switch sub-circuit 180 may be used as an auxiliary sub-circuit and used to improve the uniformity (such as the etching uniformity) of the display substrate.

Figure 3B:
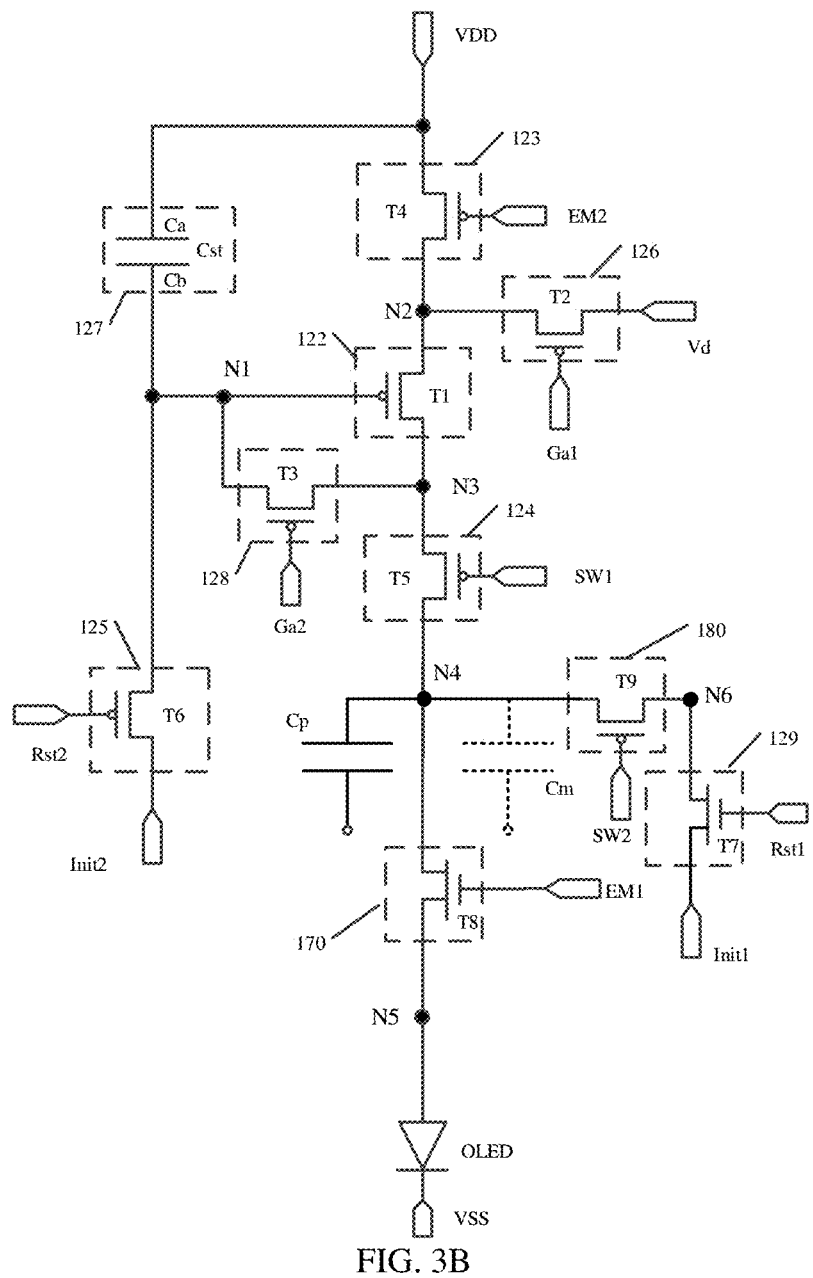
FIG. 3B is a circuit diagram of a specific example of the pixel circuit shown in FIG. 3A.

FIG. 3B illustrates a circuit diagram of a specific example of the circuit shown in FIG. 3A; for example, as shown in FIG. 3B, the second switch sub-circuit 180 may be implemented as a ninth transistor T9; the gate electrode of the ninth transistor T9 is configured to receive the second switch control signal SW2; and the first electrode and the second electrode of the ninth transistor T9 are connected with the fourth node N4 and the sixth node N6 respectively. The specific description may refer to the description of FIG. 1B, and is not repeated here.

At least one embodiment of the present disclosure also provides a driving method of a pixel circuit, which is used to drive the pixel circuit provided by any embodiment. The driving method at least includes: at the data write and compensation stage, the data write sub-circuit is turned on, and the first switch sub-circuit and the first light-emitting control sub-circuit are turned off, so that the data signal is written to the second node, and the driving sub-circuit is compensated; at the pre-charging stage, the first switch sub-circuit is turned on, and the first light-emitting control sub-circuit is turned off so as to charge the fourth node, so that the potential of the fourth node reaches a preset value; and at the light-emitting stage, the first switch sub-circuit and the first light-emitting control sub-circuit are turned on, the potential of the fourth node is applied to the fifth node, and the driving signal is applied to the light-emitting element, so that the light-emitting element emits light. The specific description may refer to the above descriptions, and is not repeated here. For example, the driving signal may be a driving voltage or a driving current used to drive the light-emitting element.

At least one embodiment of the present disclosure also provides a display substrate, which includes the pixel circuit provided by any embodiment.

Figure 4A:
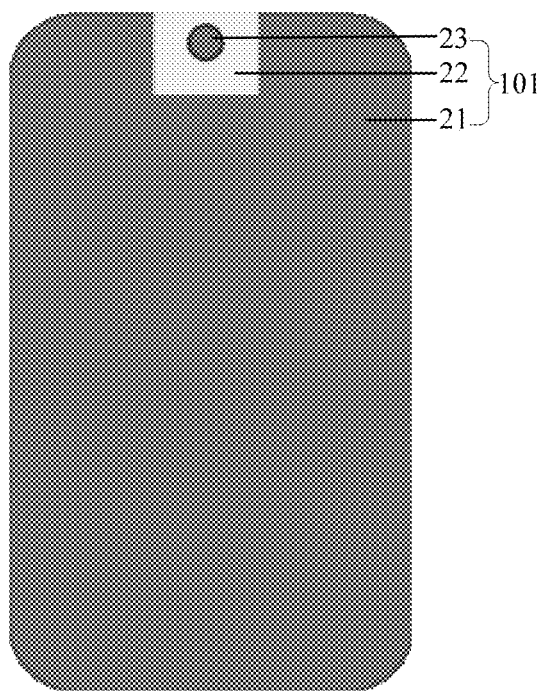
FIG. 4A is a first schematic diagram of a display substrate provided by at least one embodiment of the present disclosure.

FIG. 4A is a first schematic plan view of the display substrate provided by an embodiment of the present disclosure, and FIG. 4A illustrates the layout of a display area of the display substrate. As shown in FIG. 4A, a display area 101 of the display substrate 20 is divided into a main display area 21 and relevant areas of a photosensitive element (such as a camera). For example, the relevant areas include a first display area 22 and a second display area 23, and the first display area at least partially or totally surrounds the second display area 23. For example, the photosensitive element is provided corresponding to the second display area 23.

Figure 4B:
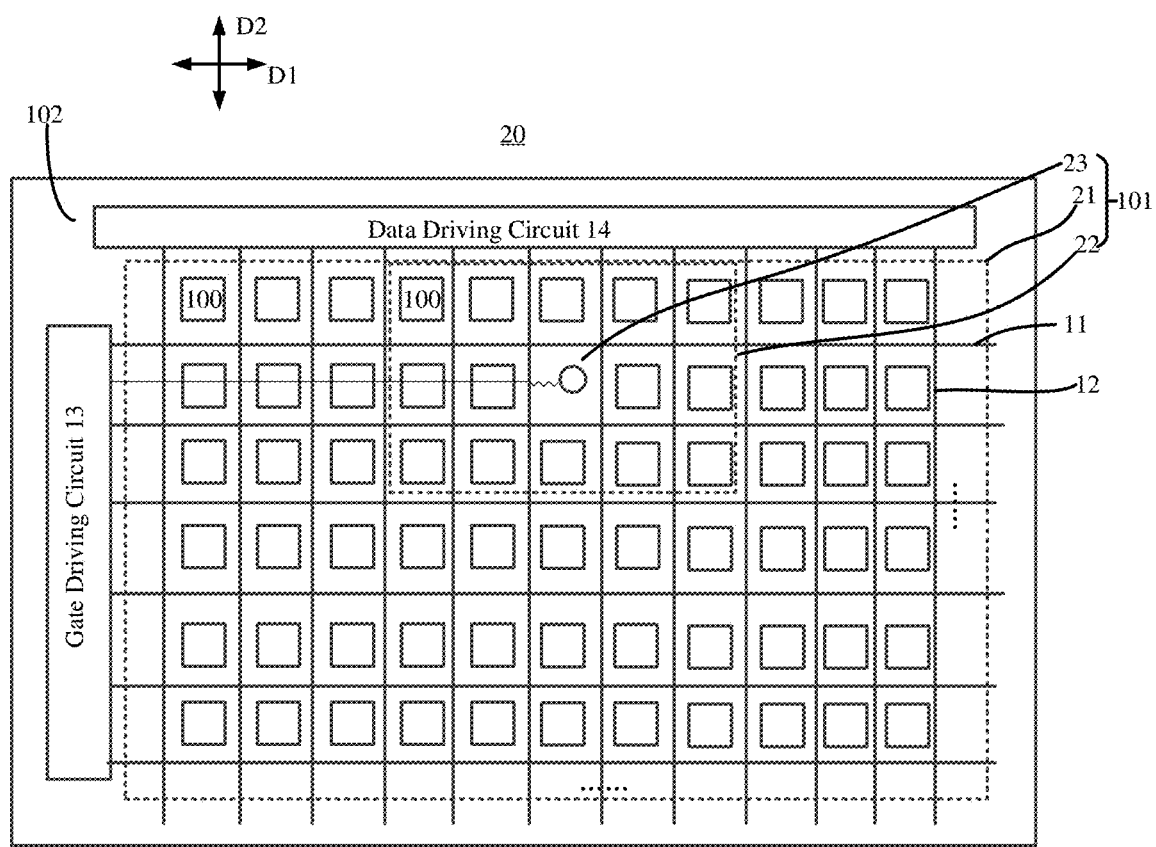
FIG. 4B is a second schematic diagram of the display substrate provided by at least one embodiment of the present disclosure.

FIG. 4B is a second schematic plan view of the display substrate provided by an embodiment of the present disclosure, and FIG. 4B illustrates a pixel layout of the display substrate. As shown in FIG. 4B, the display substrate 20 includes a plurality of pixel circuits 100 located in the display area 101, and FIG. 4B schematically illustrates the pixel circuit 100 with a rectangular block. For example, each pixel circuit 100 may adopt the pixel circuit provided by any one embodiment of the present disclosure. For example, the structure of the pixel circuit 100 may be adjusted correspondingly when the area where the pixel circuit 100 is located is different.

As shown in FIG. 4B, the plurality of pixel circuits 100 are arranged in multiple rows and multiple columns along a first direction D1 and a second direction D2; and the first direction D1 and the second direction D2 are different, for example, the two are orthogonal. For example, the pixel rows and the pixel columns do not necessarily extend linearly, may also extend along a curve (such as a fold line), and the curve generally extends along the first direction D1 or the second direction D2. For example, the density of the pixel circuits in the first display area 22 and that in the main display area 21 are the same, thereby improving the uniformity of the process.

For example, in the main display area 21, a connection line between the pixel circuit and the light-emitting element driven by the pixel circuit of each sub-pixel is relatively short, for example, the pixel circuit and the light-emitting element of the sub-pixel both are located in the main display area, which may realize the in-situ light emission. For example, the pixel circuits 100 in the main display area 21 may adopt the pixel circuits shown in FIGS. 1A-1B or FIGS. 2A-2B.

For example, the pixel circuit structure in the second display area 23 is not complete, and a part of the pixel circuit structure may be in the second display area, which aims at increasing the light transmission rate of the second display area 23, thereby improving the photosensitive effect of the photosensitive element. For example, in order to improve the display uniformity, the light-emitting element is arranged in the second display area 23, but a main structure of the pixel circuit driving the light-emitting element is arranged in the first display area 22 on the periphery of the second display area 23. FIG. 4B schematically illustrates the light-emitting element in the second display area 23 with a circle, and the light-emitting element is connected with the pixel circuit structure or a signal line in the first display area 22 through a connection line (illustrated as the fold line in FIG. 4B). When one side of the display substrate opposite to the display side is provided with the photosensitive element, the to-be-detected light reaches the photosensitive element mainly via the second display area 23, which is described in detail below.

For example, in the first display area 22, the pixel circuits of some sub-pixels are used to drive the light-emitting elements located in the second display area 23. In order to facilitate the description, these sub-pixels are referred to as first sub-pixels hereinafter.

For example, the size of the pixel circuits in the first display area 22 is reduced in the first direction D1, so that the number of the pixel circuits is greater than the number of the light-emitting elements. For example, the pixel circuits of the sub-pixels may adopt the pixel circuits shown in FIGS. 3A-3B. For example, there are some in-situ light-emitting sub-pixels in the first display area 22.

For example, the driving sub-circuit 122 and the first switch sub-circuit 124 of the first sub-pixel are located in the first display area 22, and the first light-emitting control sub-circuit 170 and the light-emitting element 120 are located in the second display area 23; and the second terminal of the first light-emitting control sub-circuit is connected with the first electrode of the light-emitting element 120 electrically, and the first terminal of the first light-emitting sub-circuit is connected electrically with the first switch sub-circuit located in the first display area 22 through a connection line (corresponding to the fourth node N4).

For example, the connection line extends to the first display area 22 from the second display area 23, and is prone to form parasitic capacitance with other conductive structures during the extension; the first light-emitting control sub-circuit 170 is arranged in the second display area, that is, arranged at one end of the connection line close to the light-emitting element, and can space the connection line apart from the light-emitting element effectively, which prevents the connection line from being connected with the light-emitting element directly, so that the adverse effect of the parasitic capacitor at the connection line on the light emission is reduced effectively. For example, before the light-emitting stage, the first switch sub-circuit 124 may be turned on, and the first light-emitting control sub-circuit 170 is turned off, so that the connection line may be pre-charged (for example, charged to the lighting voltage of the light-emitting element); and at the light-emitting stage, the first switch sub-circuit 124 and the first light-emitting control sub-circuit 170 are turned on simultaneously, and under the action of the driving signal, the prepared potential on the connection line is copied to the pixel electrode rapidly, so that the display Mura phenomenon caused by the occupation of the charging time needed by the parasitic capacitor on the light-emitting time is avoided, and the light-emitting uniformity is improved.

As shown in FIG. 4B, the display substrate includes a plurality of gate lines 11 and a plurality of data lines 12. For example, the gate lines 11 extend along the first direction D1, and the data lines 12 extend along the second direction D2. FIG. 4B only illustrates a general position relationship of the gate lines 11, the data lines 12 and the pixel circuits 100 in the display substrate, and details may be designed according to actual requirements. FIG. 4B illustrates that each gate line 11 and each data line 12 pass through the first display area 21 and the second display area 22, which is only used for facilitating the drawing, but shall not be used as the limitation to the present disclosure.

For example, as shown in FIG. 4B, the display substrate 20 includes a non-display area 102 located outside the display area 101. The display substrate may also include a gate driving circuit 13 and a data driving circuit 14 located in the non-display area. The gate driving circuit 13 is connected with a pixel circuit unit 100 through the gate lines 11 to provide various scanning signals and control signals, and the data driving circuit 14 is connected with the pixel circuits 100 through the data lines 12 to provide the data signal Vd.

For example, the display substrate 20 may also include a control circuit (not shown). For example, the control circuit is configured to control the data driving circuit 14 to apply the data signal and control the gate electrode driving circuit to apply the scanning signal. One example of the control circuit is a sequence control circuit (T-con). The control circuit may be in various forms, for example, including a processor and a storage device; and the storage device includes an executable code, and the processor runs the executable code to execute the above detecting method.

For example, the processor may be a central processing unit (CPU) or other forms of processing devices with data processing capacity and/or instruction execution capacity, and may include, for example, a microprocessor, a programmable logic controller (PLC), etc.

For example, the storage device may include one or more computer program products; and the computer program product may include various forms of computer-readable storage media, such as volatile memory and/or nonvolatile memory. The volatile memory, for example, may include a random access memory (RAM) and/or a cache. The nonvolatile memory, for example, may include a read only memory (ROM), a hard disk, a flash memory, etc. One or more computer program instructions may be stored on the computer readable storage media; and the processor may run desirable functions of the program instruction. Various application programs and various data may also be stored in the computer readable storage media.

The structure of the display substrate provided by at least one embodiment of the present disclosure is exemplarily explained below by taking the pixel circuits shown in FIGS. 3A-3B adopted by the first sub-pixel as an example in conjunction with FIGS. 5A-5C, FIG. 6, FIGS. 7A-7B, FIGS. 8A-8B and FIGS. 9A-9B, but this does not limit the present disclosure.

Figure 5A:
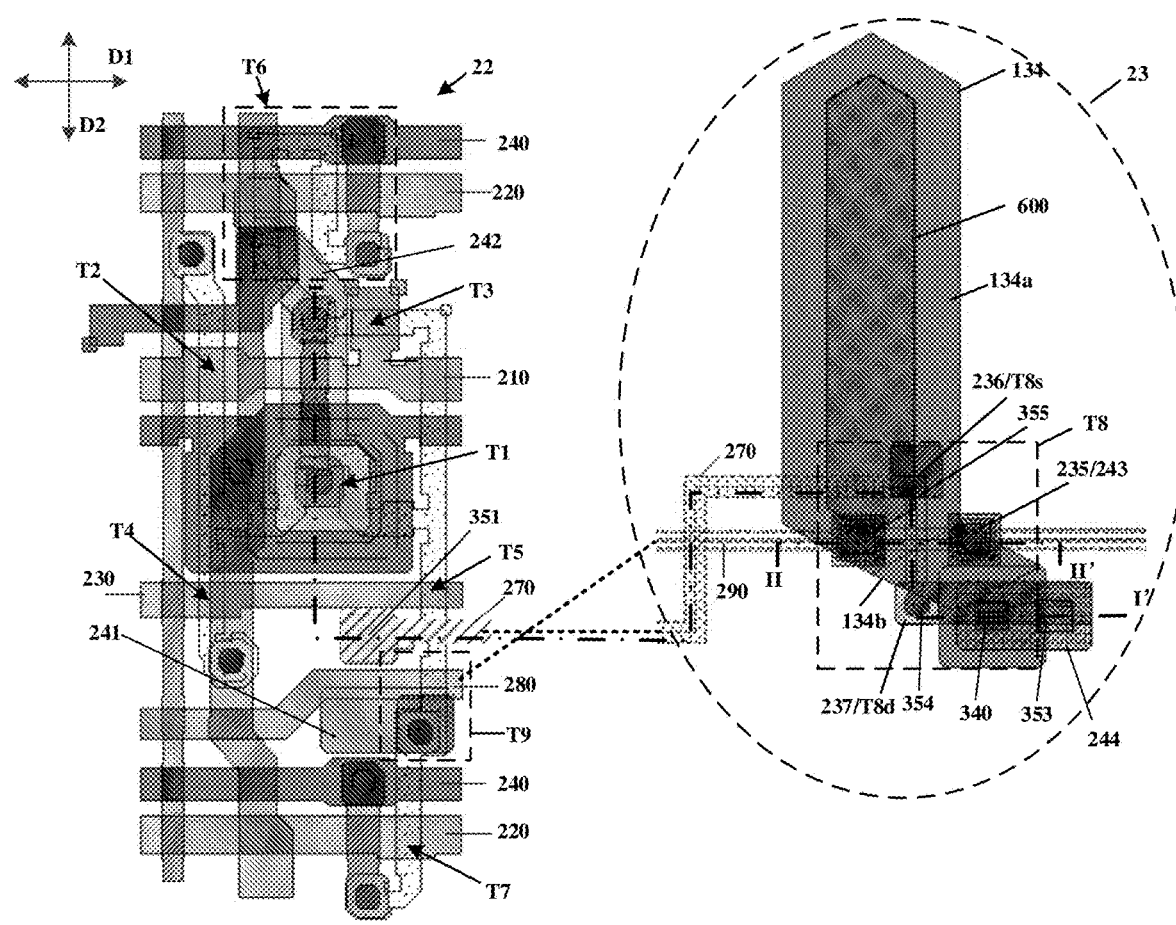
FIG. 5A is a third schematic diagram of the display substrate provided by at least one embodiment of the present disclosure.
Figure 5B:
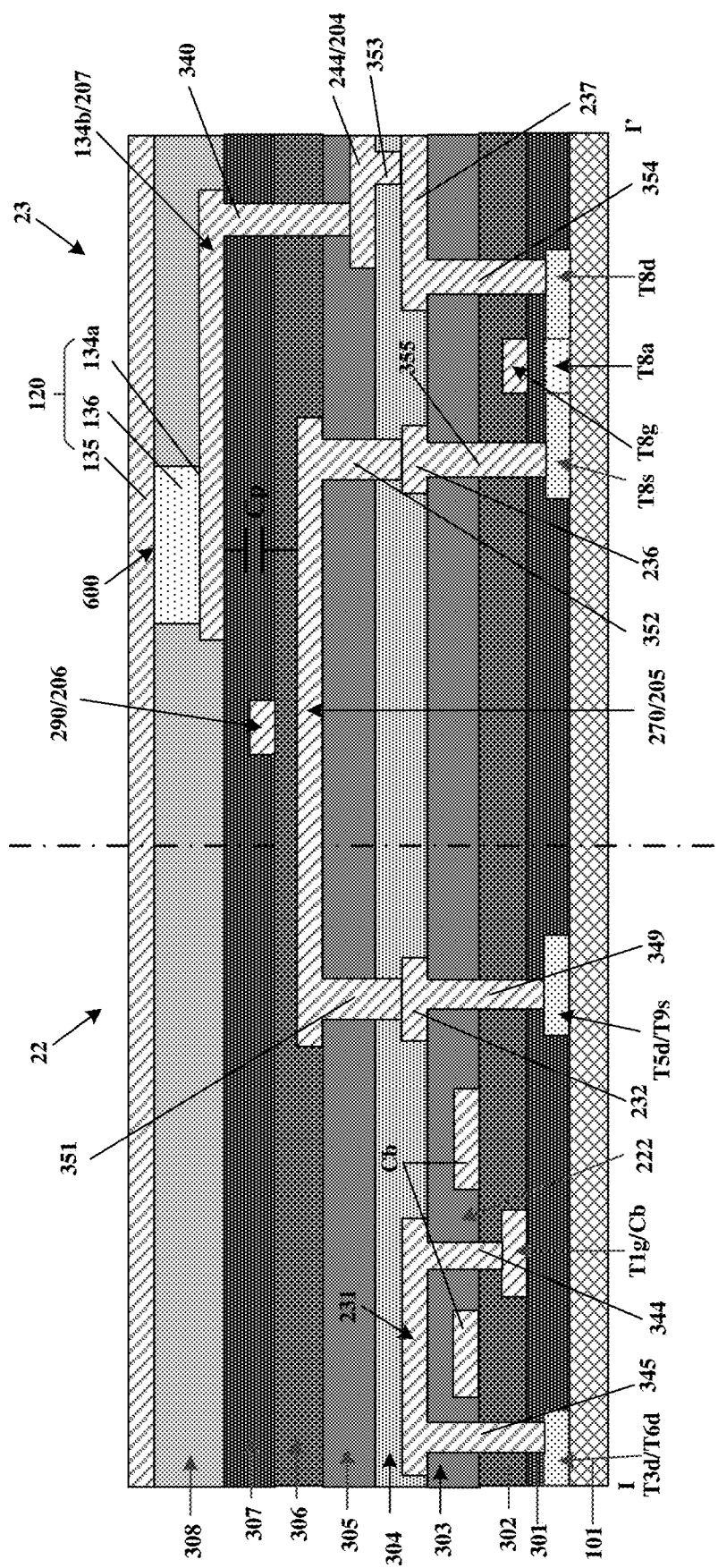
FIG. 5B is a sectional view of FIG. 5A along a sectional line I-I'.
Figure 5C:
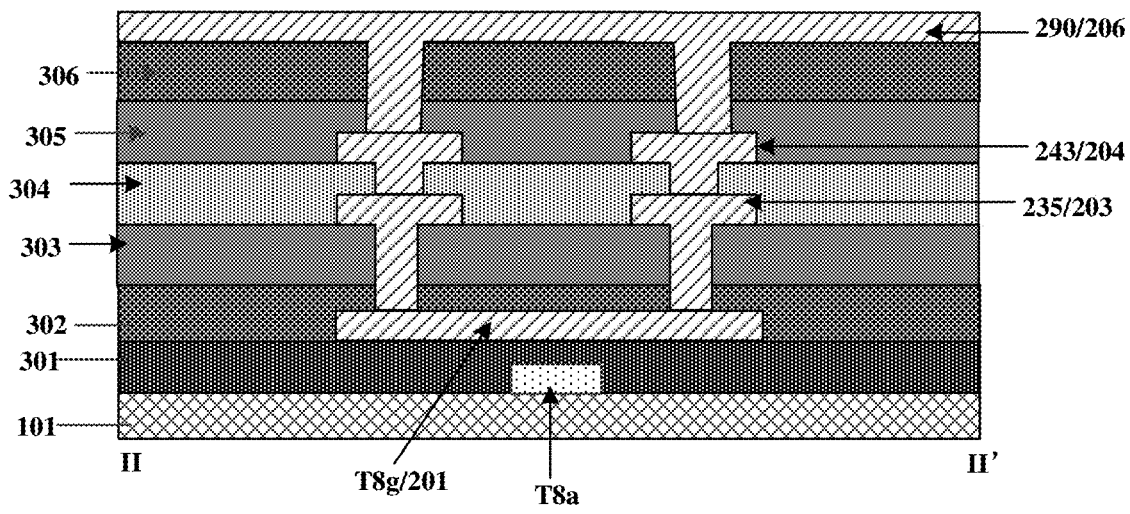
FIG. 5C is a sectional view of FIG. 5A along a sectional line II-II'.

FIG. 5A is a schematic diagram of a first sub-pixel in a display substrate 20 provided by at least one embodiment of the present disclosure; FIG. 5B is a sectional view of FIG. 5A along a sectional line I-I'; and FIG. 5C is a sectional view of FIG. 5A along a sectional line II-II'. It should be noted that for the sake of clarity, FIG. 5B and FIG. 5C respectively omit some structures without direct electrical connection at the sectional line.

As shown in FIGS. 5A-5B, except for the first light-emitting control sub-circuit (T8), other sub-circuits in the pixel circuit of the first sub-pixel all are located in the first display area 22; and the first light-emitting control sub-circuit and the light-emitting element 120 of the first sub-pixel are located in the second display area 23. The first light-emitting control sub-circuit is connected with a pixel structure located in the first display area 22 through the connection line 270. One end of the connection line 270 is connected with the first light-emitting control sub-circuit electrically through a via hole 352 and the connection line 270 extends to the first display area 22 from the second display area 23 so as to be connected with the first switch sub-circuit and the second switch sub-circuit electrically. For example, the other end of the connection line 270 is connected with the second terminal (i.e. T5d) of the first switch sub-circuit and the first terminal (i.e. T9s) of the second switch sub-circuit electrically through a via hole 351. For example, the connection line 270 is made of a transparent conductive material, which is conducive to increasing the light transmission rate of the second display area 23. FIG. 5A only illustrates the connecting structure at two ends of the connection line 270, and schematically illustrates a structure of a middle portion of the connection line with a dotted line. The sectional line I-I' extends to the second display area 23 from the first display area 22 along the connection line 270.

It may be seen from FIGS. 5A-5C that a semiconductor layer 102, a first insulating layer 301, a first conductive layer 201, a second insulating layer 302, a second conductive layer 202, a third insulating layer 303, a third conductive layer 203, a fourth insulating layer 304, a fourth conductive layer 204, a fifth insulating layer 305, a fifth conductive layer 205, a sixth insulating layer 306, a sixth conductive layer 206, a seventh insulating layer 307 and a seventh conductive layer 207 are arranged on an base substrate 101 successively, thereby forming the structure of the display substrate as shown in FIG. 5A.

Figure 6:
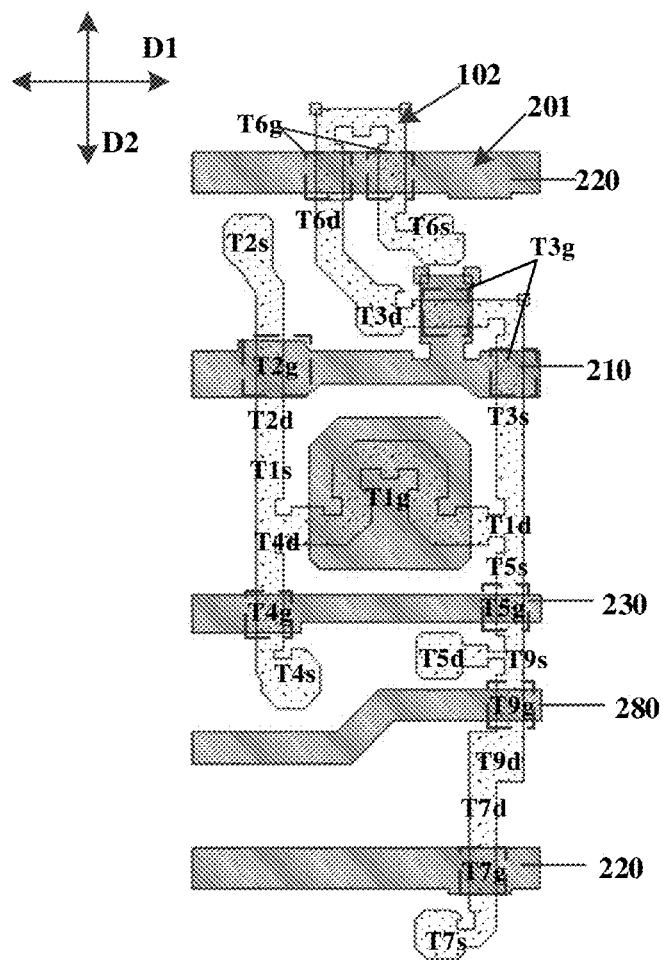
FIG. 6 is fourth a schematic diagram of the display substrate provided by at least one embodiment of the present disclosure.
Figure 7A:
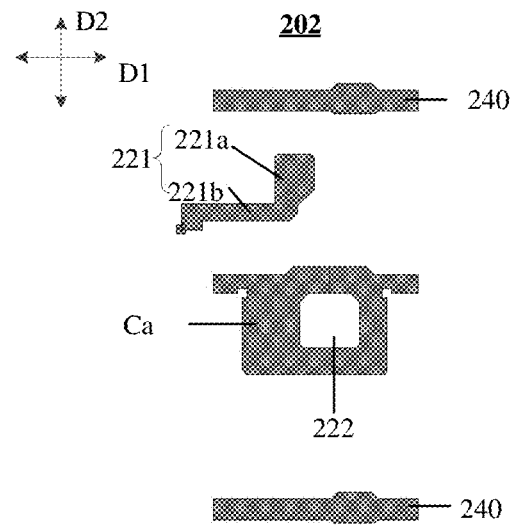
FIG. 7A is a fifth schematic diagram of the display substrate provided by at least one embodiment of the present disclosure.
Figure 7B:
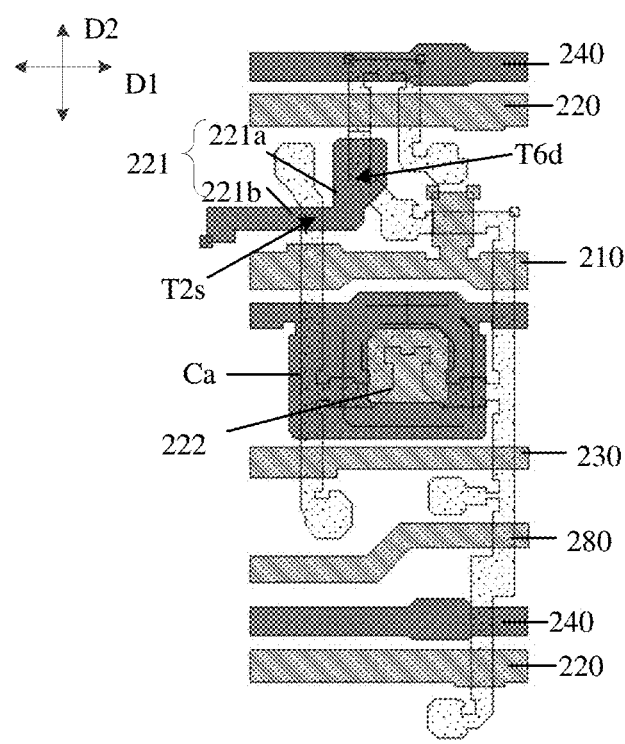
FIG. 7B is a sixth schematic diagram of the display substrate provided by at least one embodiment of the present disclosure.
Figure 8A:
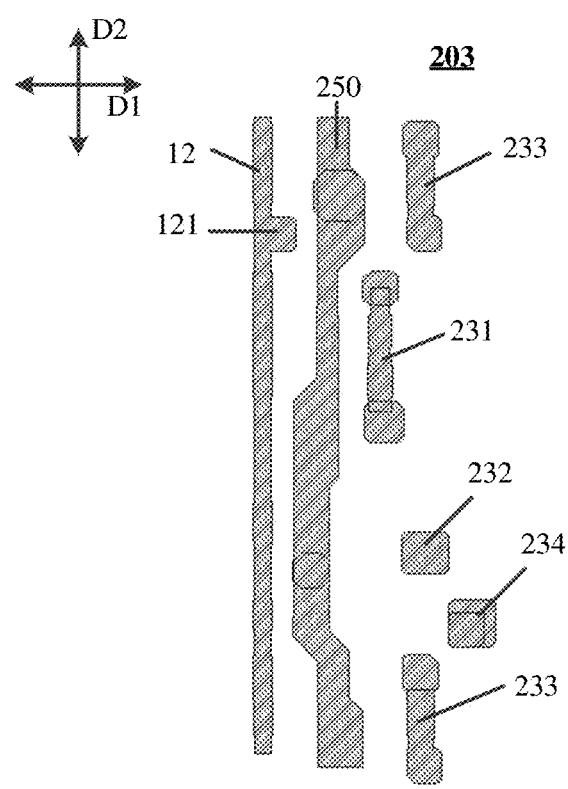
FIG. 8A is a seventh schematic diagram of the display substrate provided by at least one embodiment of the present disclosure.
Figure 8B:
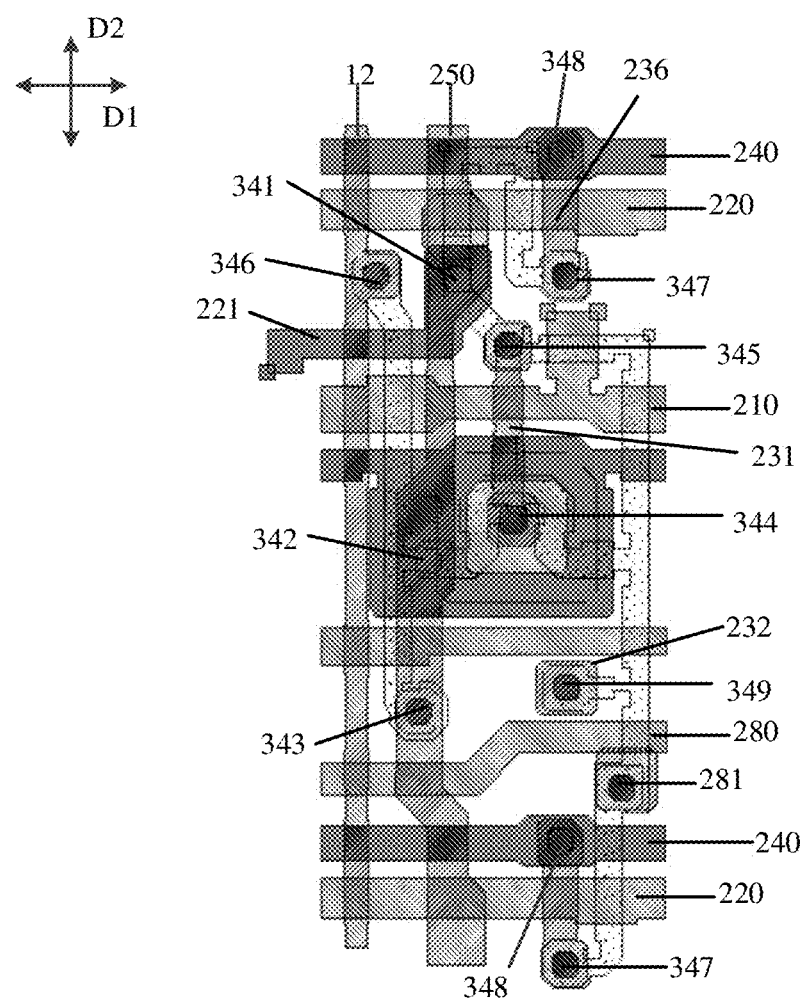
FIG. 8B is an eighth schematic diagram of the display substrate provided by at least one embodiment of the present disclosure.
Figure 9A:
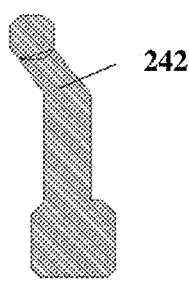
FIG. 9A is a ninth schematic diagram of the display substrate provided by at least one embodiment of the present disclosure.
Figure 9B:
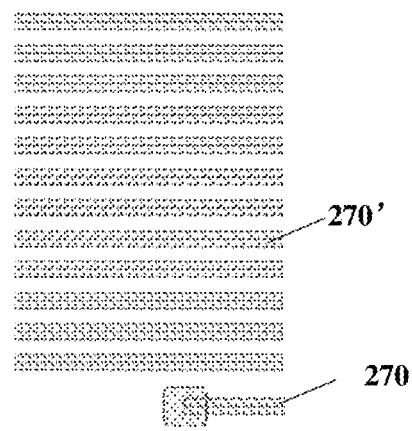
FIG. 9B is a tenth schematic diagram of the display substrate provided by at least one embodiment of the present disclosure.

Corresponding to FIG. 5A, FIG. 6 illustrates the semiconductor layer 102 and the first conductive layer (a gate electrode layer) 201 of the transistors T1-T7 and T9 in the first display area 22 in the pixel circuit of the first sub-pixel; FIG. 7A illustrates the second conductive layer 202; FIG. 7B illustrates the second conductive layer 202 on the basis of FIG. 6; FIG. 8A illustrates the third conductive layer 203; FIG. 8B illustrates the third conductive layer 203 on the basis of the FIG. 7B; and FIG. 9A and FIG. 9B illustrate the fourth conductive layer 204 and the fifth conductive layer 205 respectively.

To facilitate the description, Tng, Tns, Tnd and Tna are used to indicate the gate electrode, the first electrode, the second electrode and an active layer of the $n^{th}$ transistor Tn respectively in the following description, wherein n is 1-9.

It should be noted that the term "arranged in the same layer" in the present disclosure means that two (or more than two) structures are formed by a same deposition process and patterned by a same patterning process, and are made from the same or different materials. The term "integrated structure" in the present disclosure means that two (or more than two) structures are interconnected structures that are formed by the same deposition process and patterned by the same patterning process, and are made from the same or different materials.

For example, as shown in FIG. 6, the first conductive layer 201 includes a gate electrode of each transistor and some scanning lines and control lines. FIG. 6 illustrates the gate electrodes T1g-T7g and T9g of the transistors T1-T7 and T9 in the first sub-pixel with a dashed line box.

The semiconductor layer 102 includes active layers T1a-T7a and T9a of the transistors T1-T7 and T9. As shown in FIG. 6, the active layers of the transistors T1-T7 and T9 are connected with each other into an integrated structure. For example, referring to FIG. 5C, the first conductive layer also includes a gate electrode T8g of the eighth transistor T8 located in the second display area 23, and the semiconductor layer 102 also includes an active layer T8a of the eighth transistor T8.

For example, the display substrate 20 adopts a self-alignment process, and the first conductive layer 201 is used as a mask to perform conducting processing (such as doping processing) on the semiconductor layer 102, to enable a portion of the semiconductor layer 102 that is not covered by the first conductive layer 201 to become a conductor, so that portions of the semiconductor layer located at two sides of the active layer (a channel area) of each transistor become conductors, thereby forming the first electrode and the second electrode of the transistor respectively.

The stability of the gate electrode voltage of the driving transistor greatly influences the display uniformity of the display substrate. For example, if the leakage phenomenon of the gate electrode of the driving transistor is serious, the gate electrode voltage of the driving transistor may be compensated insufficiently at a threshold compensation stage, that is, the threshold voltage of the driving transistor may not be compensated completely, so that the driving current at the light-emitting stage is still related to the threshold voltage Vth of the driving transistor, resulting in the reduction of the brightness uniformity of the display device.

For example, as shown in FIG. 6, the third transistor T3 and the sixth transistor T6 adopt a double-gate structure respectively, so that the gate control capacity of the transistor may be improved, and the leakage current may be reduced. Since the third transistor T3 and the sixth transistor T6 both are directly connected with the gate electrode of the first transistor T1 (i.e. the driving transistor), the stability of the third transistor T3 and the sixth transistor T6 affects the stability of the voltage of the gate electrode (the node N1) of the first transistor T1 directly. The double-gate structure is used to improve the gate control capacity of the third transistor T3 and the sixth transistor T6, which is conducive to reducing the leakage current of the transistor and maintaining the voltage of the node N1, so that at the compensation stage, the threshold voltage of the first transistor T1 can be compensated sufficiently, thereby improving the display uniformity of the display substrate at the light-emitting stage.

For example, the first conductive layer 201 also includes a plurality of scanning lines 210, a plurality of reset control lines 220 and a plurality of light-emitting control lines 230 that are insulated to each other. For example, as shown in FIG. 6, each row of sub-pixels corresponds to a reset control line 220, a scanning line 210, a second light-emitting control line 230 and a first light-emitting control line (280, 290).

The scanning line 210 is connected (or integrated) with the gate electrode of the second transistor T2 in a corresponding row of sub-pixels to provide the first scanning signal Ga1; the reset control line 220 is connected with the gate electrode of the sixth transistor T6 in a corresponding row of sub-pixels electrically to provide the second reset control signal Rst2; and the second light-emitting control line 230 is connected with the gate electrode of the fourth transistor T4 in a corresponding row of sub-pixels electrically to provide the second light-emitting control signal EM2.

For example, as shown in FIG. 6, the scanning line 210 is also connected with the gate electrode of the third transistor T3 electrically to provide the second scanning signal Ga2, that is, the first scanning signal Ga1 and the second scanning signal Ga2 may be the same signal; and the light-emitting control line 230 is also connected with the gate electrode of the fifth transistor T5 electrically to provide the first switch control signal SW1, that is, the first light-emitting control signal EM1 and the second light-emitting control signal EM2 are the same signal.

Referring to FIG. 5A and FIG. 5C together, the first light-emitting control line includes a first light-emitting control line portion 280 (an example of an auxiliary light-emitting control line of the present disclosure) located in the first display area 22 and a second light-emitting control line portion 290 located in the second display area 23; and the first light-emitting control line portion 280 and the second light-emitting control line portion 290 are connected electrically with each other (as shown by the dotted line in FIG. 5A). The second light-emitting control line portion 290 is connected with (or integrated with) the gate electrode of the eighth transistor T8 (an example of the light-emitting control transistor of the present disclosure) of a corresponding row of sub-pixels to provide the first light-emitting control signal EM1; and the first light-emitting control line portion 280 is connected with (or integrated with) the gate electrode of the ninth transistor T9 of a corresponding row of sub-pixels electrically to provide the second switch control signal SW2, that is, in the embodiments of the present disclosure, the first light-emitting control signal EM1 and the second switch control signal SW2 are the same signal, but this does not limit the present disclosure. For example, the second light-emitting control line portion 290 is made of a transparent conductive material to increase the light transmission rate of the second display area 23.

For example, the main display area 21 is provided with second sub-pixels, for example, the second sub-pixel is an in-situ light-emitting sub-pixel; and all sub-circuits (transistors) in the pixel circuit of the second sub-pixel are located in the main display area 21, that is, the first light-emitting control sub-circuit and other sub-circuits are not separated as shown in FIG. 5A. For example, the pixel circuit of the second sub-pixel may not include the second switch sub-circuit, for example, may adopt the pixel circuits shown in FIGS. 1A-1B or FIGS. 2A-2B; in this case, the first light-emitting control sub-circuit may be located at a position where the second switch sub-circuit shown in FIG. 5A is located, that is, the eighth transistor T8 is located at the position where the ninth transistor T9 is located; and the first light-emitting control line portion 280 shown in FIG. 5A serves as the first light-emitting control signal EM1 that controls the first light-emitting control sub-circuit.

Therefore, in the pixel circuit shown in FIG. 5A, the arrangement of the second switch sub-circuit (T9) and the first light-emitting control line portion 280 is conducive to improving the layout uniformity of the pixel circuits of the second display area 23 and the first display area 21, thereby improving the process uniformity of a production process.

For example, the gate electrode of the seventh transistor T7 of the present row of pixel circuits is connected electrically with the reset control line 220 corresponding to the next row of pixel circuits (that is, the pixel circuit rows corresponding to the scanning line that is turned on sequentially after the scanning line corresponding to the present row according to a scanning sequence of the scanning lines) to receive the first reset control signal Rst1.

For example, as shown in FIGS. 7A-7B, the second conductive layer 202 includes the first capacitive electrode Ca. The first capacitive electrode Ca overlaps with the gate electrode T1g of the first transistor T1 in a direction perpendicular to the base substrate 101 to form the storage capacitor Cst, that is, the gate electrode T1g of the first transistor T1 serves as the second capacitive electrode Cb of the storage capacitor Cst. For example, the first capacitive electrode Ca includes an opening 222; and the opening 222 exposes at least part of the gate electrode T1g of the first transistor T1 to allow the gate electrode T1g to be connected electrically with other structures.

For example, the second conductive layer 202 may also include a plurality of reset voltage lines 240 extending along the first direction D1, and the plurality of reset voltage lines 240 are respectively connected with the plurality of rows of sub-pixels in a one-to-one correspondence. The reset voltage line 240 is connected electrically with the first electrode of the sixth transistor T6 in the corresponding row of sub-pixels to provide the second reset voltage Init2.

For example, referring to FIG. 7B and FIG. 8B, the first electrodes of the seventh transistors T7 in the present row of sub-pixels are connected electrically with the reset voltage line 240 corresponding to the next row of sub-pixels to receive the first reset voltage Init1.

For example, as shown in FIGS. 7A-7B, the second conductive layer 202 may also include a shielding electrode 221. For example, the shielding electrode 221 overlaps with the first electrode T2s of the second transistor T2 in a direction perpendicular to the base substrate 101, so that the signal in the first electrode T2s of the second transistor T2 is protected against the interference of other signals. Since the first electrode T2s of the second transistor T2 is configured to receive the data signal Vd, and the data signal Vd determines a display gray level of the sub-pixel, the shielding electrode 221 improves the stability of the data signal, thereby improving the display performance.

For example, referring to FIG. 7B and FIG. 6, the shielding electrode 221 also at least partially overlaps with the second electrode T6d of the sixth transistor T6 in the direction perpendicular to the base substrate 101 to improve the stability of the signal on the second electrode T6d, so that the stability of the sixth transistor T6 is improved, and the gate electrode voltage of the first transistor T1 is further stabilized.

For example, the shielding electrode 221 and the first electrode T2s of the second transistor T2 right opposite to (overlapping with) the shielding electrode and the second electrode T6d of the sixth transistor T6 form the stable capacitor. For example, the shielding electrode 221 is configured to load the constant voltage; and since the voltage difference between the two ends of the capacitor cannot be changed suddenly, the stability of the voltage on the first electrode T2c of the second transistor T2, the conductive area T3c of the third transistor T3 and the second electrode T6d of the sixth transistor T6 is improved. For example, the shielding electrode 221 is connected with a power supply line 250 in the third conductive layer 203 to load the first power supply voltage VDD.

For example, as shown in FIGS. 7A-7B, the shielding electrode 221 is L-shaped or V-shaped, and includes a first branch 221a and a second branch 221b with different extension directions. The first branch 221a at least partially overlaps with the second electrode T6d of the sixth transistor T6 in the direction perpendicular to the base substrate 101; and the second branch 221b at least partially overlaps with the first electrode T2s of the second transistor T2 in the direction perpendicular to the base substrate 101. For example, the first branch 221a extends along the second direction D2, and the second branch 221b extends along the first direction D1.

For example, as shown in FIGS. 8A-8B, the third conductive layer 203 includes a plurality of power supply lines 250 extending along the second direction D2. For example, the plurality of power supply lines 250 are respectively electrically connected with the plurality of columns of sub-pixels to provide the first power supply voltage VDD in a one-to-one correspondence. Referring to FIG. 6, the power supply line 250 is connected with the first capacitive electrodes Ca in a corresponding column of sub-pixels through a via hole 342, and connected with the first electrode T4d of the fourth transistor T4 electrically through a via hole 343. For example, the power supply line 250 is also connected with the shielding electrode 221 electrically through the via hole 341, so that the shielding electrode 221 has a constant potential, and the shielding capacity of the shielding electrode is improved. For example, the via hole 342 and the via hole 341 each passes through the third insulating layer 303; and the via hole 343 passes through the first insulating layer 301, the second insulating layer 302 and the third insulating layer 303.

For example, the third conductive layer 203 also includes a plurality of data lines 12 extending along the second direction D2. For example, the plurality of data lines 12 are respectively electrically connected with a plurality of columns of sub-pixels to provide the data signal in a one-to-one correspondence. For example, the data line 12 is connected with the first electrode T2s of the second transistor T2 in a corresponding column of sub-pixels electrically through a via hole 346 to provide the data signal. For example, the via hole 346 passes through the first insulating layer 301, the second insulating layer 302 and the third insulating layer 303.

For example, the data line 12 includes a data line main body extending along the second direction D2; since the data line main body is small in width, the data line 12 also includes a data line projection 121 extending from the data line main body for facilitating the arrangement of the via hole, and the data line projection 121 at least partially overlaps with the via hole 346 in the direction perpendicular to the base substrate.

For example, as shown in FIGS. 5A-5B and FIGS. 8A-8B, the third conductive layer 203 also includes a connection electrode 231, one end of the connection electrode 231 is electrically connected with the gate electrode T1g (i.e. the second capacitive electrode Cb) of the first transistor T1 through the opening 222 in the first capacitive electrode Ca and the via hole 344 in the insulating layer, and the other end of the connection electrode 231 is connected with the second electrode T3d of the third transistor T3 through the via hole 345, so that the second capacitive electrode Cb is connected with the second electrode T3d of the third transistor T3 electrically. For example, the via hole 344 passes through the second insulating layer 302 and the third insulating layer 303. For example, the via hole 345 passes through the first insulating layer 301, the second insulating layer 302 and the third insulating layer 303.

As shown in FIGS. 5A-5B, FIG. 6 and FIGS. 8A-8B, the third conductive layer 203 also includes a connection electrode 232; and the connection electrode 232 is electrically connected with the second electrode T5d of the fifth transistor T5 through a via hole 349, and also electrically connected with the connection line 270 through a via hole 351. For example, the via hole 349 passes through the first insulating layer 301, the second insulating layer 302 and the third insulating layer 303. The via hole 351 passes through the fourth insulating layer 304 and the fifth insulating layer 305.

For example, as shown in FIGS. 8A-8B, the third conductive layer 203 also includes a connection electrode 233; one end of the connection electrode 233 is connected with a reset voltage line 240 electrically through a via hole 348, and the other end of the connection electrode 233 is connected with the first electrode T7s of the seventh transistor T7 electrically through a via hole 347, so that the first electrode T7s of the seventh transistor T7 may receive the first reset voltage Init1 from the reset voltage line 240. For example, the via hole 348 passes through the third insulating layer 303. For example, the via hole 347 passes through the first insulating layer 301, the second insulating layer 302 and the third insulating layer 303.

For example, as shown in FIGS. 8A-8B, the third conductive layer 203 also includes a connection electrode 234; and the connection electrode 234 is connected with the first electrode T9s of the ninth transistor T9 and the second electrode T7d of the seventh transistor electrically through a via hole (not shown). The connection electrode 234 is arranged to be consistent with patterns of the third conductive layer 203 in the main display area 21 so as to improve the etching uniformity. For example, in the main display area 21, the second electrode T7d of the seventh transistor is electrically connected with the first electrode of the light-emitting element through the connection electrode 234.

For example, FIG. 8B illustrates two reset voltage lines 240; the reset voltage line 240 that is correspondingly connected with the first electrode of the seventh transistor T7 in the previous row of sub-pixels is connected with the first terminal of the sixth transistor T6 of the present row of sub-pixels to provide the second reset voltage Init2; and the reset voltage line 240 that is correspondingly connected with the first electrode of the seventh transistor T7 in the present row of sub-pixels is connected with the sixth transistor T6 of the next row of sub-pixels to provide the second reset voltage Init2.

As shown in FIG. 9A, the fourth conductive layer 204 includes a connection electrode 241 and a shielding electrode 242. Referring to FIG. 3A, the connection electrode 241 is electrically connected with the connection electrode 234 through a via hole (not shown). The connection electrode 241 is arranged to be consistent with patterns of the fourth conductive layer 204 in the main display area 21 so as to improve the etching uniformity. For example, in the main display area 21, the second electrode T7$d$ of the seventh transistor is electrically connected with the first electrode of the light-emitting element through the connection electrode 234 and the connection electrode 241.

For example, in the direction perpendicular to the base substrate, the shielding electrode 242 at least partially overlaps with the connection electrode 231 to shield the connection electrode 231, so as to improve the stability of the gate electrode signal of the first transistor T1 (i.e. the driving transistor). For example, the pixel circuit in the first display area 22 is electrically connected with the first light-emitting control sub-circuit in the second pixel area 23 through a connection line (referring to the connection line 270' of FIG. 9B), the connection line is prone to overlap with the connection electrode 231 in the direction perpendicular to the base substrate during the extension, and the signal on the connection line is prone to affect the gate signal on the connection electrode 231. By arranging the shielding electrode 242, the stability of the gate signal of the driving transistor may be improved, thereby improving the display quality. For example, the shielding electrode 242 is connected with a power supply line 250 electrically through a via hole (not shown) to load the first power supply voltage VDD.

For example, an orthographic projection of the shielding electrode 242 on the base substrate covers the orthographic projection of the connection electrode 231 on the base substrate, thereby improving the shielding effect.

For example, the shielding electrode 242 at least partially overlaps with the second electrode T6$d$ of the sixth transistor T6 in the direction perpendicular to the base substrate 101 to improve the stability of the signal on the second electrode T6$d$, so that the stability of the sixth transistor T6 is improved, and the gate electrode voltage of the first transistor T1 is further stabilized.

FIG. 9B illustrates a pattern of the fifth conductive layer 205 corresponding to the position of the first sub-pixel. As shown in FIG. 9B, besides the lowermost connection line 270 connected with the first sub-pixel, the fifth conductive layer 205 also includes a plurality of connection lines 270' connected with other sub-pixels; and the connection lines 270' pass through the position of the first sub-pixel during the extension.

Referring to FIG. 5A and FIG. 5C, the third conductive layer 203 may also include a connection electrode 235 located in the second display area 23; and the fourth conductive layer 204 may also include a connection electrode 243 located in the second display area 23. The connection electrode 235 and the connection electrode 243 correspond to the eighth transistor T8, for example, the number of the connection electrode 235 and the connection electrode 243 is two respectively; and the two connection electrodes 235 are arranged in a one-to-one correspondence with the two connection electrodes 243, and correspond to the two ends of the gate electrode T8$g$ of the eighth transistor T8, and the two ends of the gate electrode T8$g$ are connected with the second light-emitting control line portion 290 located above respectively through the corresponding connection electrodes 235 and 243.

For example, referring to FIGS. 5A-5C, the third conductive layer 203 may also include a connection electrode 236 (an example of the first connection electrode of the present disclosure) and a connection electrode 237 located in the second display area 23; the connection electrodes 236 and 237 correspond to the first electrode T8$s$ and the second electrode T8$d$ of the eighth transistor T8 respectively; and the connection electrode 236 is electrically connected with the first electrode T8$s$ of the eighth transistor T8 through a via hole 355 (an example of the first via hole of the present disclosure), and the connection electrode 237 is electrically connected with the second electrode T8$d$ of the eighth transistor through a via hole 354 (an example of the second via hole of the present disclosure). The connection electrode 236 is also connected electrically with the connection line 270 located above through a via hole 352 (another example of the first via hole of the present disclosure), so that the first electrode T8$s$ of the eighth transistor T8 is connected with the connection line 270 electrically. For example, the fourth conductive layer 204 may also include a connection electrode 244; the connection electrode 244 corresponds to the connection electrode 237 and is connected with the connection electrode 236 electrically through a via hole 353 (another example of the second via hole of the present disclosure); and the connection electrode 236 is connected electrically with the first electrode 134 of the light-emitting element located above through a via hole 340, so that the second electrode T8$d$ of the eighth transistor T8 is connected to the first electrode 134 of the light-emitting element electrically.

The connection electrodes 235, 236, 237, 243 and 244 all serve as transfer electrodes, and lead the first electrode/the second electrode of the transistor located below out to be connected electrically with the conductive structure (the signal line or electrode) that is located above; the arrangement can avoid poor connection, broken line or unevenness caused by excessively deep filling depth of the conductive materials in the direction perpendicular to the base substrate due to the direct penetration of the via holes; and by arranging the transfer electrode, the depth of the via hole is reduced, and the contact yield is improved.

As shown in FIG. 5B, the via holes 340, 353 and 354 at the second electrode of the eighth transistor T8 do not overlap with each other in the direction perpendicular to the base substrate.

Referring to FIGS. 5A-5C, the fifth conductive layer 205 includes the connection line 270; and the connection line 270 extends to the second display area 23 from the first display area 22, so that the circuit structure located in the first display area 22 is connected with the circuit structure located in the second display area 23. One end of the connection line 270 is connected electrically with the second electrode T5$d$ of the fifth transistor T5/the first electrode T9$s$ of the ninth transistor T9 through the via hole 351, and the other end of the connection line 270 is connected electrically with the first electrode T8$s$ of the eighth transistor T8 through the via hole 352.

Referring to FIGS. 5A-5C, the sixth conductive layer 206 includes a second light-emitting control line portion 290, for example, the second light-emitting control line portion 290 is located in the second display area 23, and the second light-emitting control line portion 290 is connected electrically with the connection electrode 243 located below through a via hole, so as to be connected to the gate electrode T8g of the eighth transistor T8 to provide the first light-emitting control signal EM1.

Referring to FIGS. 5A-5B, the seventh conductive layer 207 includes the first electrode 134 of the light-emitting element 120.

For example, referring to FIGS. 5A-5B, the display substrate 20 may also include a pixel defining layer 308 located on the first electrode of the light-emitting element. An opening is formed in the pixel defining layer 308 to expose at least part of the pixel electrode 134, thereby defining an opening area (i.e. an effective light-emitting area) 600 of each sub-pixel of the display substrate. A light-emitting layer 136 of the light-emitting element 120 is at least formed in the opening (the light-emitting layer 136 may also cover part of the surface of the pixel defining layer at one side away from the first electrode of the light-emitting element), and the second electrode 135 is formed on the light-emitting layer 136, thereby forming the light-emitting element 120. For example, the second electrode 135 is a common electrode and is entirely arranged in the display substrate 20. For example, the pixel electrode 134 is an anode of the light-emitting element, and the second electrode 135 is a cathode of the light-emitting element.

FIG. 5A illustrates a position of the opening area 600 on the first electrode of the light-emitting element. For example, the first electrode 134 includes an electrode main body portion 134a and an electrode protrusion portion 134b; the electrode main body portion 134a is used to contact the light-emitting layer 136 of the light-emitting element; the electrode protrusion portion 134b is connected with the connection electrode 244 electrically through the via hole 340; and the electrode main body portion 134a does not overlap with the via hole 340 in the direction perpendicular to the base substrate, so that the via hole 340 is prevented from affecting the evenness of the light-emitting layer in the opening area and from affecting the light-emitting quality. For example, the electrode main body portion 134a is in a polygonal shape, such as quadrangle, pentagon or hexagon. For example, the electrode main body portion 134a has a symmetrical axis extending along a second direction.

For example, as shown in FIGS. 5A-5B, the orthographic projection of the first electrode 134 of the light-emitting element on the base substrate covers the orthographic projection of the connection electrode 236 on the base substrate completely. Because the connection electrode 236 is generally made of a metal material with low light transmission rate, the arrangement can prevent the connection electrode 236 from affecting the light transmission rate of the second display area 23, and also can prevent the connection electrode 236 from occupying the effective opening area, thereby improving the opening rate of the display substrate.

For example, as shown in FIGS. 5A-5B, the orthographic projection of the via hole 340/353/354 at the second electrode of the eighth transistor T8 on the base substrate is further away from the orthographic projection of the electrode main body portion 134a of the first electrode of the light-emitting element on the base substrate than the orthographic projection of the via hole 352/355 at the first electrode of the eighth transistor T8.

Since the number of the via holes at the second electrode of the eighth transistor T8 is large, a total depth of the via holes is large, and the impact on the evenness of the first electrode of the light-emitting element located above is great, arranging the via holes at the second electrode of the eighth transistor T8 away from the electrode main body portion 134a can prevent the via holes from affecting the evenness of the electrode main body portion 134a and the light-emitting layer thereon and from affecting the light-emitting quality.

For example, referring to FIGS. 5A-5B, in the direction perpendicular to the base substrate, the connection line 270 is prone to at least partially overlap with other conductive structures (such as the first electrode 134 of the light-emitting element of the first sub-pixels and/or the first electrode of the light-emitting element of other sub-pixels) during the extension, thereby forming the parasitic capacitor Cp. The eighth transistor T8 is arranged to be spaced between the connection line 270 and the first electrode of the light-emitting element, and the direct connection between the connection line 270 and the light-emitting element can be avoided, so that adverse effect of the parasitic capacitor at the connection line on the light emission can be reduced effectively. For example, before the light-emitting stage, the connection line may be pre-charged (for example, charged to the lighting voltage of the light-emitting element); and after entering the light-emitting stage, the prepared potential on the connection line 270 is copied to the first electrode of the light-emitting element rapidly, so that the display Mura phenomenon caused by the occupation of the charging time needed by the parasitic capacitor on the light-emitting time can be avoided, and the light-emitting uniformity is improved.

For example, referring to FIGS. 5A-5B, in the direction perpendicular to the base substrate, the connection line 270 at least partially overlaps with the electrode main body portion of the first electrode of the light-emitting element; and the second light-emitting control line portion 290 at least partially overlaps with the first electrode of the light-emitting element but does not overlap with or hardly overlaps with the electrode main body portion 134a. For example, in the direction perpendicular to the base substrate, the second light-emitting control line portion 290 is located at one side of the connection line 270 close to the first electrode 134 of the light-emitting element, so that the connection line 270 is prevented from affecting the evenness of the light-emitting layer in the opening area.

For example, the base substrate 101 may be a rigid substrate, such as a glass substrate, a silicon substrate, etc., and may also be formed by a flexible material with good heat resistance and durability, such as polyimide (PI), polycarbonate (PC), polyethylene terephthalate (PET), polyethylene, poly acrylates, polyarylates, polyetherimide, polyethersulfone, polyethyleneterephthalate (PET), polyethylene (PE), polypropylene (PP), polysulfone (PSF), polymethyl methacrylate (PMMA), cellulose triacetate (TCA), cycloolefin polymer (COP) and cycloolefin copolymer (COC), etc.

For example, the material of the semiconductor layer 102 includes but is not limited to a silicon material (amorphous silicon (a-Si), and polycrystalline (p-Si)), metal oxide semiconductors (IGZO, ZnO, AZO, IZTO, etc.) and organic materials (six thiophene, poly(thiophene), etc.).

For example, the materials of the first to the fourth conductive layers may include gold (Au), silver (Ag), copper (Cu), aluminum (Al), molybdenum (Mo), magnesium (Mg), tungsten (W) and alloy materials formed by combining the above metals, or conductive metal oxide materials such as indium tin oxide (ITO), indium-zinc oxide (IZO), zinc oxide (ZnO), aluminum zinc oxide (AZO), etc.

For example, the materials of the fifth conductive layer 205 and the sixth conductive layer 206 are transparent conductive materials, such as metal oxide materials, such as indium tin oxide (ITO), indium-zinc oxide (IZO), zinc oxide (ZnO), aluminum zinc oxide (AZO), etc.

For example, the light-emitting element 120 is a top emitting structure, and the first electrode (i.e. the pixel electrode) 134 has reflectivity, and the second electrode 135 has transmissivity or semi-transmissivity. For example, the first electrode 134 is an anode, and the second electrode 135 is a cathode. For example, the first electrode 134 is an ITO/Ag/ITO laminated structure; the transparent conductive material ITO is a high-work-function material, and when the transparent conductive material contacts the light-emitting material directly, a hole injection rate may be increased; and the metal material Ag is conducive to increasing the reflectivity of the first electrode. For example, the second electrode 135 is a low-work-function material serving as a cathode, such as semi-transparent metal or metal alloy material such as Ag/Mg alloy material.

For example, the first insulating layer 301, the second insulating layer 302, the third insulating layer 303, the fourth insulating layer 304, the fifth insulating layer 305 and the sixth insulating layer 306, for example, are inorganic insulating layers such as silicon oxide, silicon nitride and silicon oxides such as silicon oxynitride, silicon nitride or silicon oxynitride, or insulating materials including metal oxynitride such as aluminum oxide and titanium nitride. For example, the seventh insulating layer 307 and the pixel defining layer 308 are organic insulating materials respectively such as polyimide (PI), acrylic acid, epoxy resin, polymethyl methacrylate (PMMA), etc. For example, the seventh insulating layer 307 is a flat layer; and for example, the material of the seventh insulating layer 307 is a photoresist material.

Figure 10A:
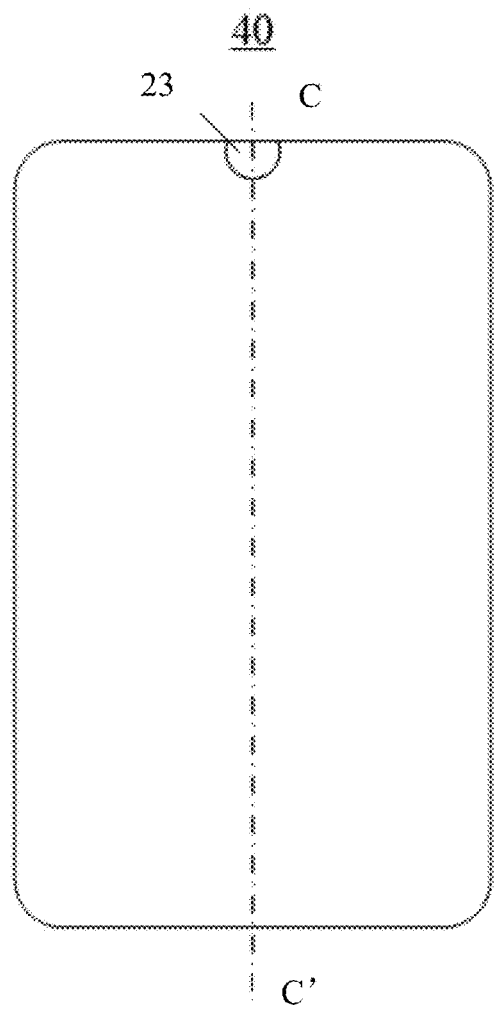
FIG. 10A is a schematic diagram of a display device provided by at least one embodiment of the present disclosure.
Figure 10B:
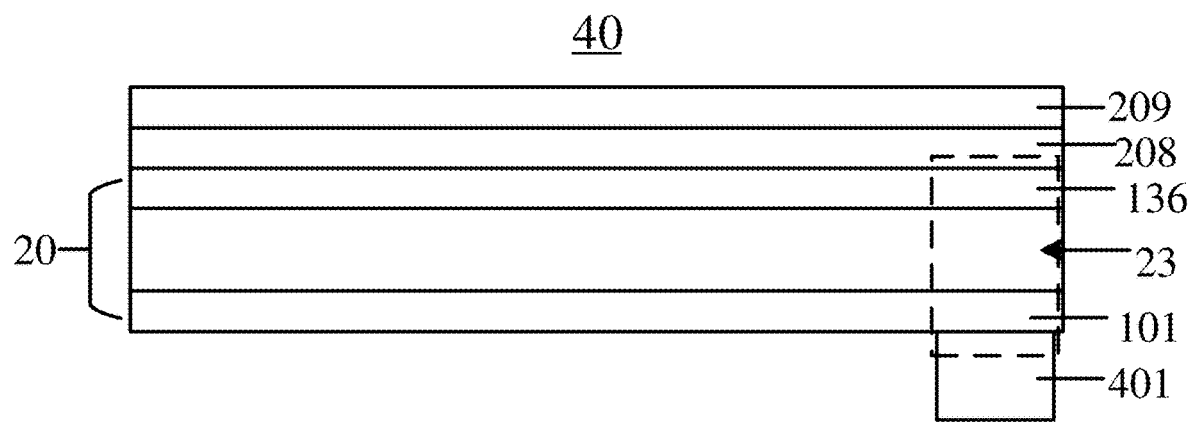
FIG. 10B is a sectional view of FIG. 10A along a sectional line C-C'.

At least one embodiment of the present disclosure also provides a display device. The display device includes the display substrate 20 provided by any one of the above embodiments and a sensor. FIG. 10A illustrates a structural schematic diagram of the display device 40 provided by some embodiments of the present disclosure; and FIG. 10B is a sectional view of FIG. 10A along a sectional line C-C'.

As shown in FIG. 10A, the sensor 401 is correspondingly arranged in the second display area 23 of the display substrate 20 and arranged at one side of the display substrate opposite to the display side, for example, arranged at the side of the base substrate 101 away from the light-emitting element. The sensor 401 is, for example, a photoelectric sensor, and is configured to receive light from the first side of the display substrate and convert the light into an electric signal for imaging. For example, the light reaches the sensor from the display side via the second display area 23, and for example, the light is visible light or infrared light. For example, in the direction perpendicular to the base substrate, the sensor 401 at least partially overlaps with the first light-emitting control sub-circuit (such as the eighth transistor T8) of the first sub-pixel.

For example, the display device 40 also includes an encapsulation layer 208 and a cover plate 209 arranged on the display substrate 20; the encapsulation layer 208 is configured to seal the light-emitting element in the display substrate 20 so as to prevent external moisture and oxygen from penetrating into the light-emitting element and the driving circuit to damage the devices. For example, the encapsulation layer 208 includes an organic film or includes a structure formed by alternately stacking organic films and inorganic films. For example, a water absorption layer (not shown) may also be arranged between the encapsulation layer 208 and the display substrate 20 and is configured to absorb residual vapor or sol of the light-emitting element in a preliminary production process. The cover plate 208 is, for example, a glass cover plate. For example, the cover plate 209 and the encapsulation layer 208 may be an integrated structure.

For example, the sensor 401 may be adhered on the back side (opposite to the display side) of the display substrate 20. As shown in FIG. 10B, an imaging element 401 is adhered at one side of the base substrate 101 away from the second electrode 136 of the light-emitting element. The sensor 401, for example, may be implemented as a camera.

The display device, for example, may be any product or part with a display function, such as a digital photo frame, a smart wristband, a smart watch, a mobile phone, a tablet computer, a monitor, a notebook computer, a navigator and the like.

The above descriptions are only exemplary implementations of the present disclosure, and are not used to limit the protection scope of the present disclosure. The protection scope of the present disclosure is determined by the appended claims.

The invention claimed is:

1. A display substrate, comprising:
a base substrate;
a plurality of sub-pixels, arranged on the base substrate in an array along a first direction and a second direction, wherein the plurality of sub-pixels comprise a first sub-pixel, and the first sub-pixel comprises a pixel circuit and a light-emitting element;
the pixel circuit comprises:
a driving sub-circuit, comprising a control terminal connected with a first node, a first terminal connected with a second node and a second terminal connected with a third node, wherein the driving sub-circuit is configured to control a driving signal from the second node to the third node for driving the light-emitting element according to a voltage of the first node;
a data write sub-circuit connected with the second node and configured to write a data signal to the second node in response to a first scanning signal;
a compensation sub-circuit connected with the first node and the third node, and configured to electrically connect the first node and the third node in response to a second scanning signal, so as to control the driving sub-circuit to write a compensation voltage to the first node according to the data signal written to the second node;
a first switch sub-circuit configured to control conduction of the driving signal between the third node and a fourth node according to a voltage of the third node in response to a first switch control signal;
a first light-emitting control sub-circuit connected with the fourth node and a fifth node, and connected with a first electrode of the light-emitting element through the fifth node, wherein the first light-emitting control sub-circuit is configured to control conduction of the driving signal between the fourth node and the fifth node in response to a first light-emitting control signal, so that the driving signal can be applied to the light-emitting element;
the display substrate comprises a first display area and a second display area, and the first display area at least partially surrounds the second display area;
the driving sub-circuit and the first switch sub-circuit of the pixel circuit both are in the first display area, and the light-emitting element and the first light-emitting control sub-circuit of the pixel circuit are in the second display area; and in a direction perpendicular to the base substrate, the first electrode of the light-emitting element is not overlapped with the driving sub-circuit.

2. The display substrate according to claim 1, the pixel circuit further comprising a first reset sub-circuit,
wherein the first reset sub-circuit is connected with the fifth node, and is configured to write a first reset voltage to the fifth node in response to a first reset control signal.

3. The display substrate according to claim 1, the pixel circuit further comprising the first reset sub-circuit,
wherein the first reset sub-circuit is connected with the fourth node, and is configured to write the first reset voltage to the fourth node in response to a first reset control signal.

4. The display substrate according to claim 1, the pixel circuit further comprising a first reset sub-circuit and a second switch sub-circuit,
wherein the first reset sub-circuit is connected with a sixth node, and is connected with the second switch sub-circuit through the sixth node, and the first reset sub-circuit is configured to write a first reset voltage to the sixth node in response to a first reset control signal; and
the second switch sub-circuit is connected with the fourth node and the sixth node, and is configured to control conduction between the fourth node and the sixth node in response to a second switch control signal, so that the first reset voltage from the first reset sub-circuit can be written to the fourth node.

5. The display substrate according to claim 1, the pixel circuit further comprising a second light-emitting control sub-circuit,
wherein the second light-emitting control sub-circuit is connected with the second node and a first power supply voltage terminal and is configured to write a first power supply voltage from the first power supply voltage terminal to the second node in response to a second light-emitting control signal.

6. The display substrate according to claim 5, the pixel circuit further comprising a storage sub-circuit,
wherein the storage sub-circuit comprises a first terminal and a second terminal, and the first terminal of the storage sub-circuit is connected with the first power supply voltage terminal and the second terminal of the storage sub-circuit is connected with the first node.

7. The display substrate according to claim 1, the pixel circuit further comprising a second reset sub-circuit,
wherein the second reset sub-circuit is connected with the first node, and is configured to write a second reset voltage to the first node in response to a second reset control signal.

8. The display substrate to claim 1, the pixel circuit further comprising a first capacitor,
wherein the first capacitor comprises a first electrode and a second electrode, the first electrode of the first capacitor is connected with the fourth node, and the second electrode of the first capacitor is configured to be applied with a same voltage as a second electrode of the light-emitting element.

9. The display substrate according to claim 1, further comprising a connection line,
wherein one end of the connection line is electrically connected with the first light-emitting control sub-circuit, and another end of the connection line is extended to the first display area so as to be electrically connected with the first switch sub-circuit; and the connection line is made of a transparent conductive material.

10. The display substrate according to claim 9, wherein in the direction perpendicular to the base substrate, the connection line is at least partially overlapped with the first electrode of the light-emitting element.

11. The display substrate according to claim 9, wherein the first light-emitting control sub-circuit comprises a light-emitting control transistor,
a first electrode of the light-emitting control transistor is electrically connected with the connection line through a first via hole; and
a second electrode of the light-emitting control transistor is electrically connected with the first electrode of the light-emitting element through a second via hole.

12. The display substrate according to claim 11, further comprising a first connection electrode,
wherein the first connection electrode is on a side of the connection line close to the base substrate in the direction perpendicular to the base substrate, and
the first electrode of the light-emitting control transistor is electrically connected with the connection line through the first connection electrode.

13. The display substrate according to claim 12, wherein an orthographic projection of the first electrode of the light-emitting element on the base substrate covers an orthographic projection of the first connection electrode on the base substrate.

14. The display substrate according to claim 11, wherein the first electrode of the light-emitting element comprises an electrode main body portion and an electrode protrusion portion protruded from the electrode main body portion, and
the electrode main body portion is used to contact a light-emitting layer of the light-emitting element, and the electrode protrusion portion is electrically connected with the second electrode of the light-emitting control transistor through the second via hole; and
an orthographic projection of the second via hole on the base substrate is further from the orthographic projection of the electrode main body portion on the base substrate than the orthographic projection of the first via hole on the base substrate.

15. The display substrate according to claim 11, further comprising a light-emitting control line in the second display area, and
the light-emitting control line is made of a transparent conductive material; and
the light-emitting control line is electrically connected with a gate electrode of the light-emitting control transistor to provide the first light-emitting control signal.

16. The display substrate according to claim 15, wherein in the direction perpendicular to the base substrate, the light-emitting control line is on a side of the connection line close to the first electrode of the light-emitting element.

17. The display substrate according to claim 15,
wherein the pixel circuit further comprises a first reset sub-circuit and a second switch sub-circuit in the first display area, the first reset sub-circuit is connected with a sixth node, and is connected with the second switch sub-circuit through the sixth node, and the second switch sub-circuit is connected with the fourth node and the sixth node, and is configured to control conduction between the fourth node and the sixth node in response to a second switch control signal, so that a first reset voltage from the first reset sub-circuit can be written to the fourth node;

the display substrate further comprises an auxiliary light-emitting control line in the first display area, and the second switch sub-circuit is connected with the auxiliary light-emitting control line to receive a second switch control signal; and the auxiliary light-emitting control line is electrically connected with the light-emitting control line in the second display area.

18. A display device, comprising the display substrate according to claim 1.

19. The display device according to claim 18, further comprising a sensor, wherein the display substrate comprises a first side for display and a second side opposite to the first side; and the sensor is arranged at the second side of the display substrate, and is configured to receive light from the first side of the display substrate and passing through the second display area for sensing.

20. The display device according to claim 1, in the direction perpendicular to the base substrate, the first electrode of the light-emitting element is not overlapped with the first switch sub-circuit.

\* \* \* \* \*